US011250909B2

(12) United States Patent
Suzuki

(10) Patent No.: US 11,250,909 B2
(45) Date of Patent: Feb. 15, 2022

(54) NONVOLATILE MEMORY AND MEMORY SYSTEM

(71) Applicant: Kioxia Corporation, Tokyo (JP)

(72) Inventor: Tomoya Suzuki, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/011,876

(22) Filed: Sep. 3, 2020

(65) Prior Publication Data

US 2021/0295908 A1 Sep. 23, 2021

(30) Foreign Application Priority Data

Mar. 19, 2020 (JP) .............................. JP2020-049649

(51) Int. Cl.
| | |
|---|---|
| *G11C 8/00* | (2006.01) |
| *G11C 11/56* | (2006.01) |
| *G11C 16/04* | (2006.01) |
| *G06F 11/10* | (2006.01) |
| *G11C 16/10* | (2006.01) |
| *G11C 16/34* | (2006.01) |
| *G11C 16/26* | (2006.01) |

(52) U.S. Cl.
CPC ...... *G11C 11/5642* (2013.01); *G06F 11/1068* (2013.01); *G11C 11/5628* (2013.01); *G11C 16/0483* (2013.01); *G11C 16/10* (2013.01); *G11C 16/26* (2013.01); *G11C 16/3404* (2013.01)

(58) Field of Classification Search
CPC ....... G11C 7/1051; G11C 7/22; G11C 7/1072; G11C 7/1006; G11C 7/1066
USPC ....................................... 365/189.15, 189.14
See application file for complete search history.

(56) References Cited

U.S. PATENT DOCUMENTS

| | | | |
|---|---|---|---|
| 8,312,348 | B2 | 11/2012 | Yamaga |
| 8,634,247 | B1 | 1/2014 | Sprouse et al. |
| 9,632,856 | B2 | 4/2017 | Chung et al. |

(Continued)

FOREIGN PATENT DOCUMENTS

| | | |
|---|---|---|
| JP | 2009-211742 A | 9/2009 |
| JP | 2011-119019 A | 6/2011 |
| JP | 2016-143085 A | 8/2016 |

OTHER PUBLICATIONS

Boncheol GU, et al., "Biscuit: A Framework for Near-Data Processing of Big Data Workloads", 2016 ACM/IEEE 43rd Annual International Symposium on Computer Architecture, IEEE Computer Society, 2016, 13 pages.

*Primary Examiner* — Son T Dinh
(74) *Attorney, Agent, or Firm* — Oblon, McClelland, Maier & Neustadt, L.L.P.

(57) ABSTRACT

According to one embodiment, a nonvolatile memory includes memory cells coupled to a word line and a control circuit. The control circuit is configured to read, from the memory cells, data including at least one partial data; determine whether or not the partial data includes an error; output, if it is determined that the partial data includes an error, the data to a memory controller; further determine, if it is determined that the partial data does not include an error, whether or not the partial data satisfies a condition; output, if it is determined that the partial data satisfies the condition, the partial data to the memory controller; and not output, if it is determined that the partial data does not satisfy the condition, the partial data to the memory controller.

24 Claims, 22 Drawing Sheets

(56) References Cited

U.S. PATENT DOCUMENTS

2013/0117632 A1* 5/2013 Fujinami ............ G06F 11/1012
  714/763
2016/0224419 A1 8/2016 Takai et al.

* cited by examiner

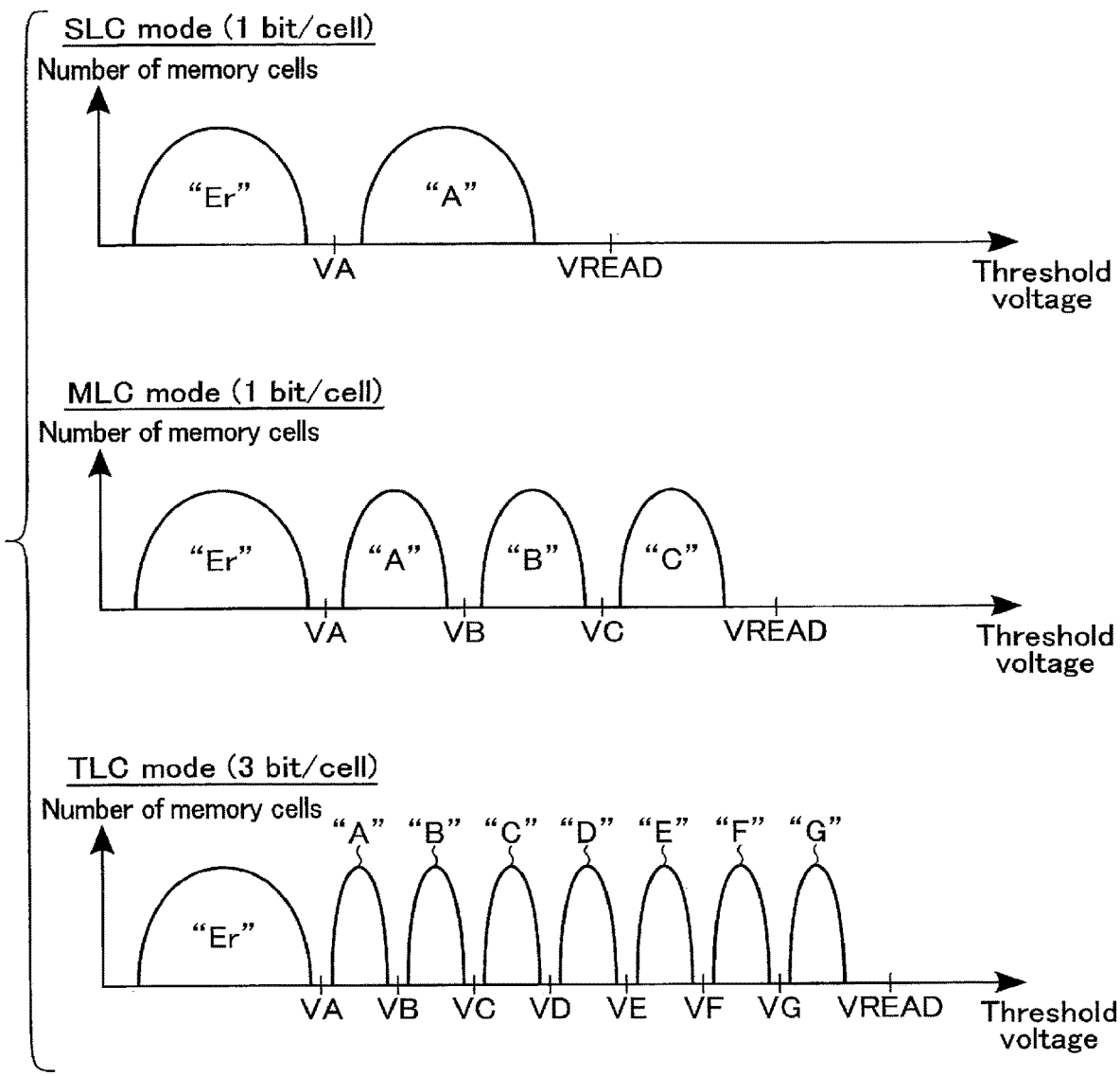
F I G. 16

FIG. 17

1 page/CU (SLC): k1, k2, k3, k4, k5, k6, k7, k8, k9, k10, k11, k12, k13, k14, k15, k16, k17, k18, k19, k20, k21, k22

3 page/CU (TLC):
- Upper: v_u1, v_u2, v_u3, v_u4, v_u5, v_u6
- Middle: v_m1, v_m2, v_m3, v_m4, v_m5, v_m6
- Lower: v_l1, v_l2, v_l3, v_l4, v_l5, v_l6

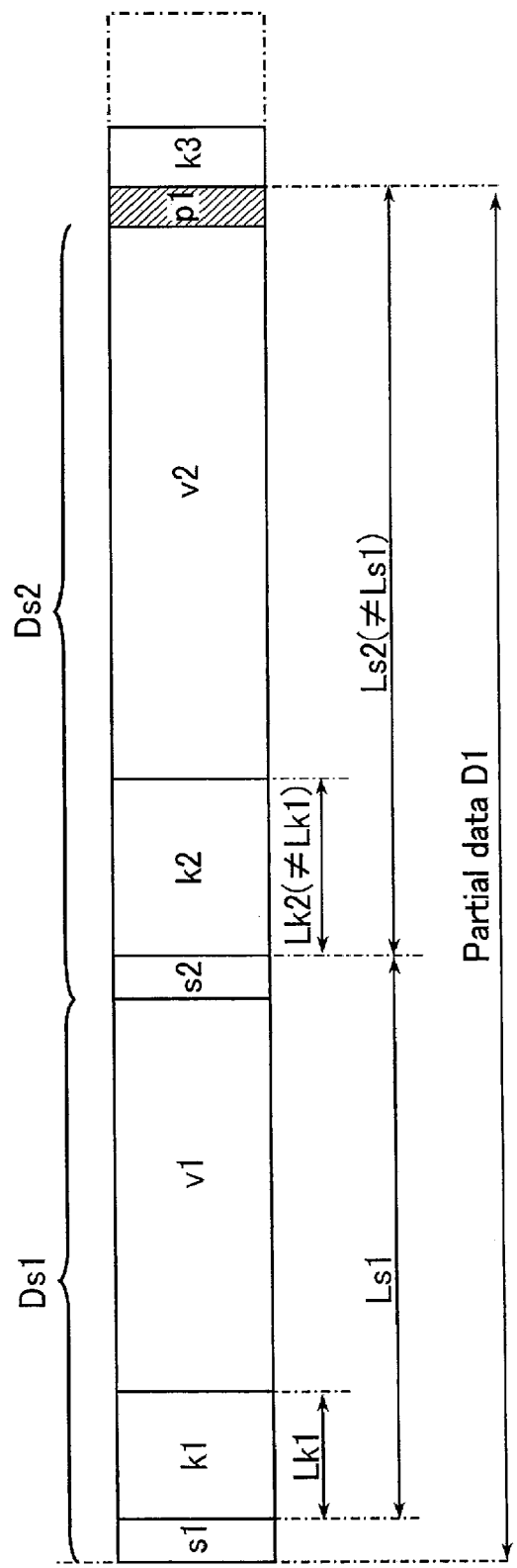
F I G. 20

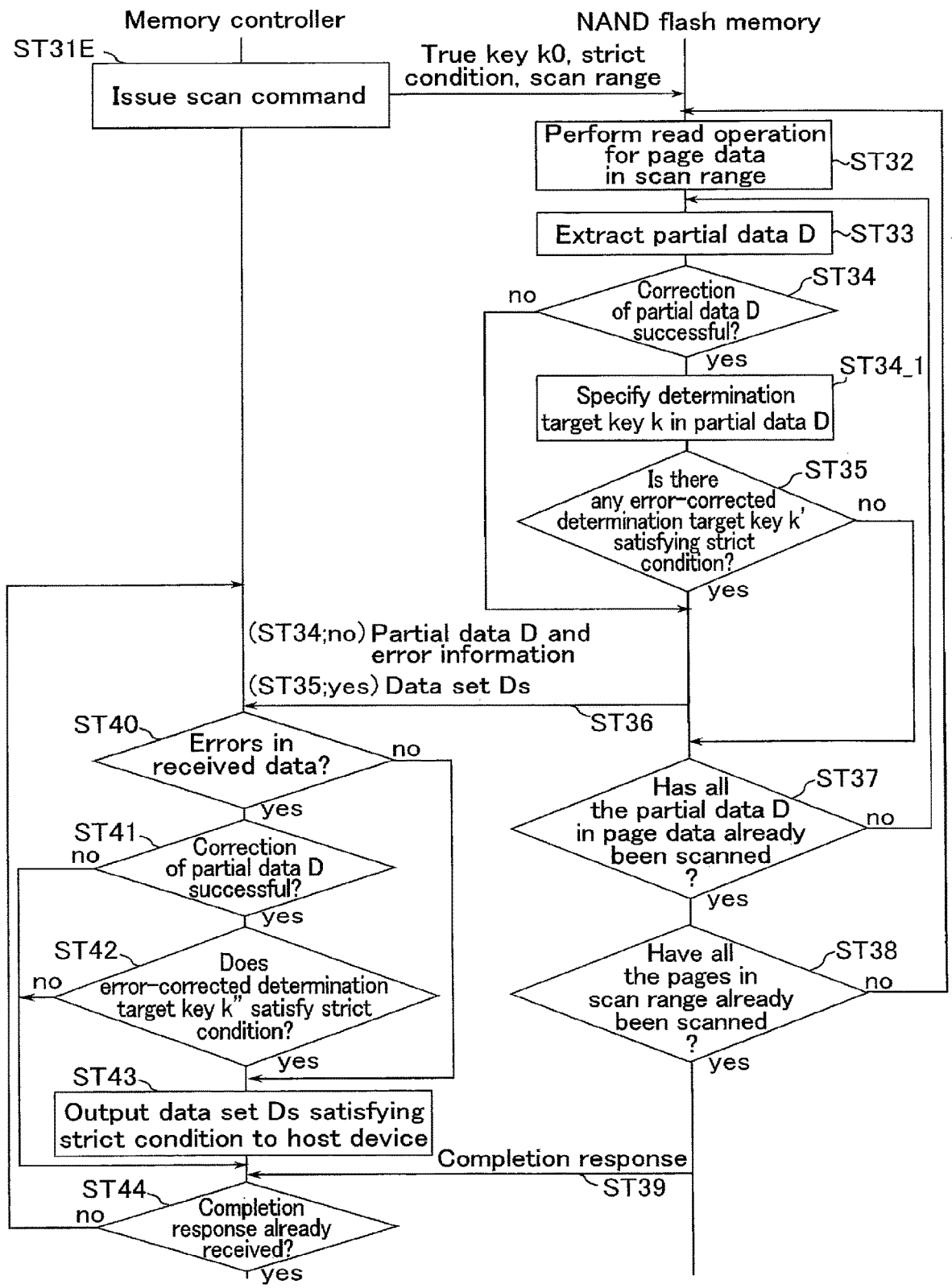
F I G. 21

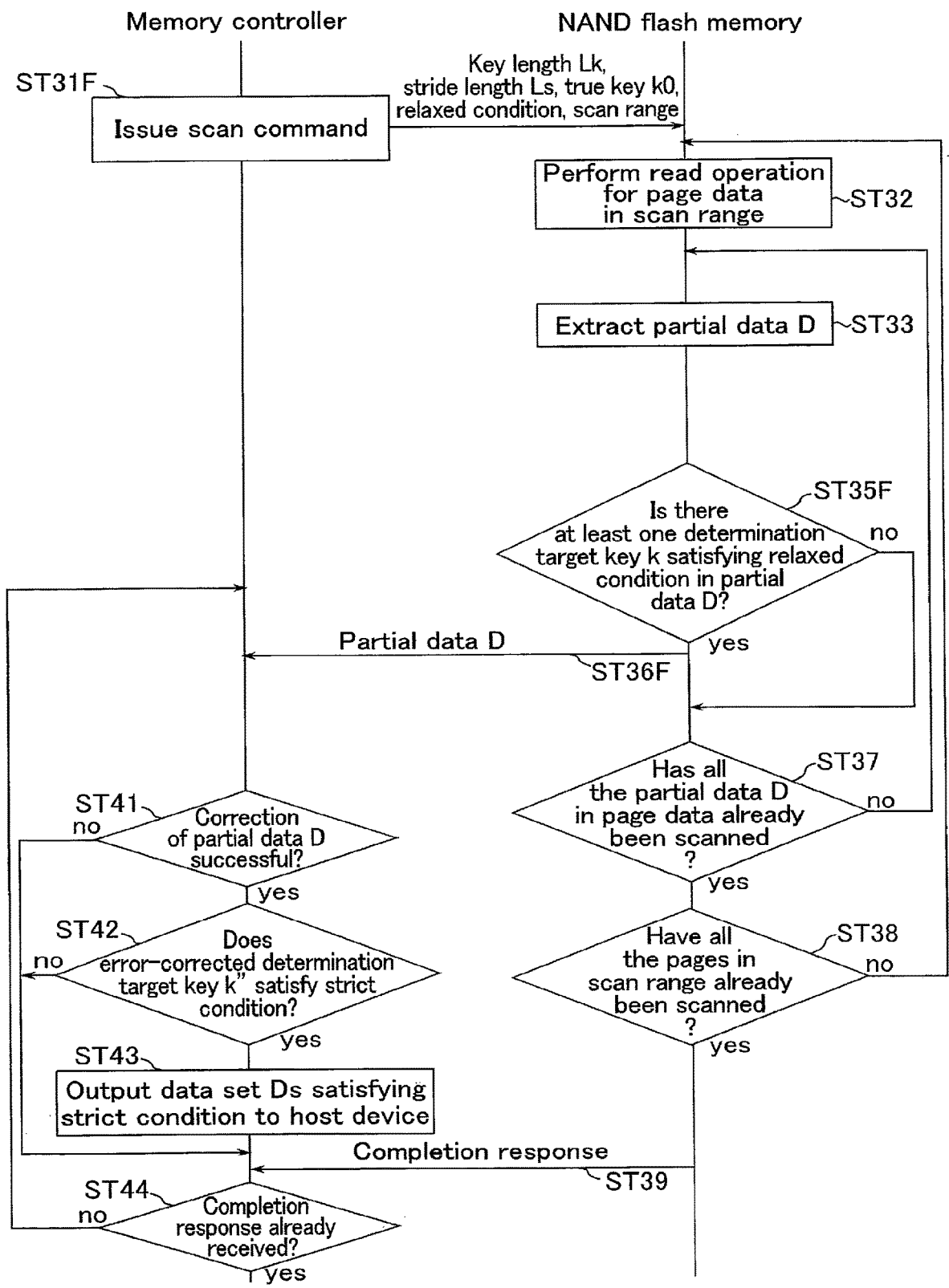
F I G. 22

NONVOLATILE MEMORY AND MEMORY SYSTEM

CROSS-REFERENCE TO RELATED APPLICATIONS

This application is based upon and claims the benefit of priority from Japanese Patent Application No. 2020-049649, filed Mar. 19, 2020, the entire contents of which are incorporated herein by reference.

FIELD

Embodiments described herein relate generally to a nonvolatile memory and a memory system.

BACKGROUND

A memory system that includes a NAND flash memory as a nonvolatile memory, and a memory controller that controls the NAND flash memory, is known.

BRIEF DESCRIPTION OF THE DRAWINGS

FIG. 16 is a schematic diagram for explaining threshold voltage distributions of memory cell transistors according to a first modification of the third embodiment.

FIG. 17 is a schematic diagram for explaining a configuration of page data according to the first modification of the third embodiment.

FIG. 20 is a schematic diagram for explaining a configuration of page data according to a fourth embodiment.

FIG. 21 is a flowchart for explaining scan processing in a memory system according to the fourth embodiment.

FIG. 22 is a flowchart for explaining scan processing in a memory system according to a modification.

DETAILED DESCRIPTION

In general, according to one embodiment, a nonvolatile memory includes a plurality of first memory cell transistors coupled to a first word line and a control circuit. In a first operation, the control circuit is configured to read, from the plurality of first memory cell transistors, a first data sequence that includes at least one first partial data sequence; determine whether or not the first partial data sequence includes an error; output, if it is determined that the first partial data sequence includes an error, the first data sequence to a memory controller; further determine, if it is determined that the first partial data sequence does not include an error, whether or not the first partial data sequence satisfies a condition; selectively output, if it is determined that the first partial data sequence satisfies the condition, the first partial data sequence to the memory controller; and not output, if it is determined that the first partial data sequence does not satisfy the condition, the first partial data sequence to the memory controller.

Hereinafter, embodiments will be described with reference to the drawings. In the description below, structural elements having the same functions and configurations will be assigned common reference symbols. To distinguish a plurality of structural elements having a common reference symbol from each other, an additional symbol is added after the common reference symbol. If there is no need to mutually distinguish a plurality of structural elements, the plurality of structural elements are assigned only a common reference symbol without an additional symbol.

1. First Embodiment

A memory system according to a first embodiment will be described. In the following, a NAND flash memory as a nonvolatile memory, and a memory system including the NAND flash memory, will be described as an example.

1.1 Configuration

A configuration of the memory system according to the first embodiment will be described.

1.1.1 Memory System

First, an overall configuration including the memory system according to the first embodiment is described with reference to FIG. 1.

Figure 1:
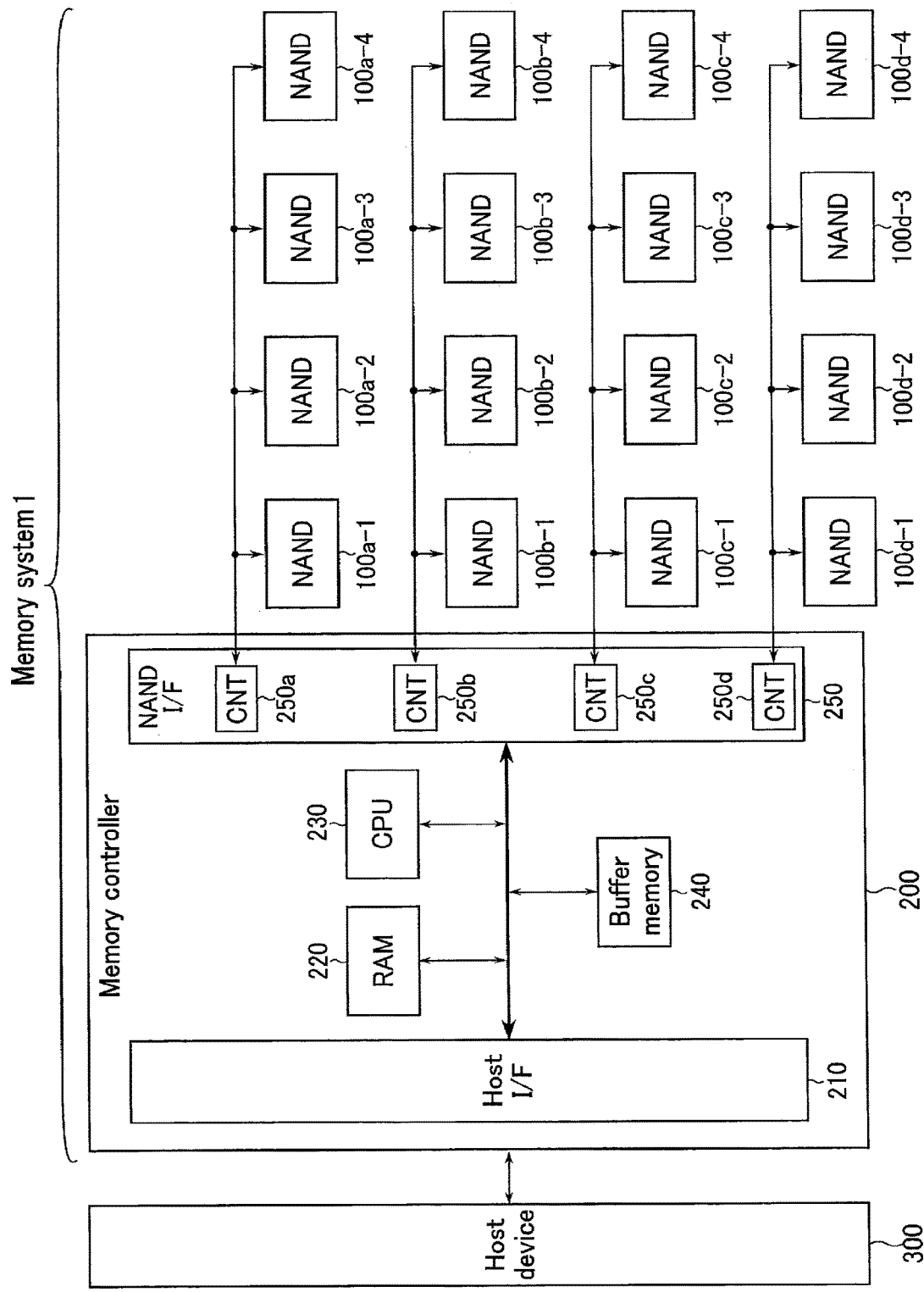
FIG. 1 is a block diagram for explaining a configuration of a memory system according to a first embodiment.

As shown in FIG. 1, the memory system 1 includes a plurality of NAND flash memories ("NAND" in FIG. 1) 100 (100a-1, 100a-2, 100a-3, 100a-4, 100b-1, 100b-2, 100b-3, 100b-4, 100c-1, 100c-2, 100c-3, 100c-4, 100d-1, 100d-2, 100d-3, and 100d-4), and a memory controller 200. The plurality of NAND flash memories 100 and the memory controller 200 may constitute a single semiconductor device in combination, for example. The semiconductor device is, for example, a memory card such as an SD™ card, or a solid state drive (SSD). The memory system 1 may be adopted in a database or a big data processing system which uses a plurality of NAND flash memories 100 as a storage medium. In the description hereinafter, any one of the plurality of NAND flash memories 100 may be referred to as "NAND flash memory 100".

The NAND flash memory 100 is a nonvolatile memory that includes a plurality of memory cells and stores data in a nonvolatile manner. The memory controller 200 is connected to the NAND flash memory 100 by a NAND bus and is connected to a host apparatus 300 by a host bus. The memory controller 200 controls the NAND flash memory 100, and accesses the NAND flash memory 100 in response to an instruction received from the host apparatus 300.

The host apparatus 300 is, for example, a digital camera or a personal computer, and the host bus is, for example, a bus compliant with an SD™ interface, an SAS (serial attached SCSI (small computer system interface)), an SATA (serial ATA (advanced technology attachment)), or a PCIe (peripheral component interconnect express).

The NAND bus is a bus compatible with an SDR (single data rate) interface, a toggle DDR (double data rate) interface, or an ONFI (open NAND flash interface), etc.

1.1.2. Memory Controller

Details of the configuration of the memory controller 200 will be described with reference to FIG. 1.

The memory controller 200 is an SoC (system on a chip) for example, and includes a host interface circuit 210, a RAM (random access memory) 220, a CPU (central processing unit) 230, a buffer memory 240, and a NAND interface circuit 250. The functions of the memory controller 200 and each of the components 210 through 250, which will be described in the following, can be realized by a hardware structure, or a combination of hardware resources and firmware.

The host interface circuit 210 is coupled to the host apparatus 300 via the host bus, and transfers instructions and data received from the host apparatus 300 to the CPU 230 and the buffer memory 240, respectively. The host interface circuit 210 also transfers data in the buffer memory 240 to the host apparatus 300.

The RAM 220 is, for example, a semiconductor memory, such as a DRAM, and is used as a work area of the CPU 230. The RAM 220 stores firmware for managing the NAND flash memory 100, various management tables, and the like.

The CPU 230 controls the operation of the entire memory controller 200. For example, upon receipt of a write instruction from the host apparatus 300, the CPU 230 issues, in response thereto, a write instruction to the NAND interface 250. Similar processing is performed at the time of a read operation and an erase operation. The CPU 230 also executes various types of processing for managing the NAND flash memory 100.

The buffer memory 240 temporarily stores write data and read data.

The NAND interface circuit 250 is coupled to the NAND flash memory 100 via the NAND bus to communicate with the NAND flash memory 100. Then, the NAND interface circuit 250 outputs various types of signals to the NAND flash memory 100 based on the instruction received from the CPU 230. At the time of a write operation, the NAND interface circuit 250 transfers the write command issued by the CPU 230 and the write data in the buffer memory 240 to the NAND flash memory 100 as input signals. At the time of a read operation, the NAND interface circuit 250 transfers the read command issued by the CPU 230 to the NAND flash memory 100 as an input signal, and receives the data read from the NAND flash memory 100 as an input signal and transfers it to the buffer memory 240.

Specifically, the NAND interface circuit 250 includes a plurality of NAND controllers ("CNT" in FIG. 1) 250a, 250b, 250c, and 250d.

Each of the plurality of NAND controllers 250a, 250b, 250c, and 250d is associated with a NAND flash memory 100 set which includes some of the plurality of NAND flash memories 100, and sends and receives data to and from the associated NAND flash memory 100 set. In the example shown in FIG. 1, the NAND controller 250a is coupled to a plurality of NAND flash memories 100a-1, 100a-2, 100a-3, and 100a-4. The NAND controller 250b is coupled to a plurality of NAND flash memories 100b-1, 100b-2, 100b-3, and 100b-4. The NAND controller 250c is coupled to a plurality of NAND flash memories 100c-1, 100c-2, 100c-3, and 100c-4. The NAND controller 250d is coupled to a plurality of NAND flash memories 100d-1, 100d-2, 100d-3, and 100d-4.

Next, details of the configuration of the NAND controller 250a will be described with reference to FIG. 2.

Figure 2:
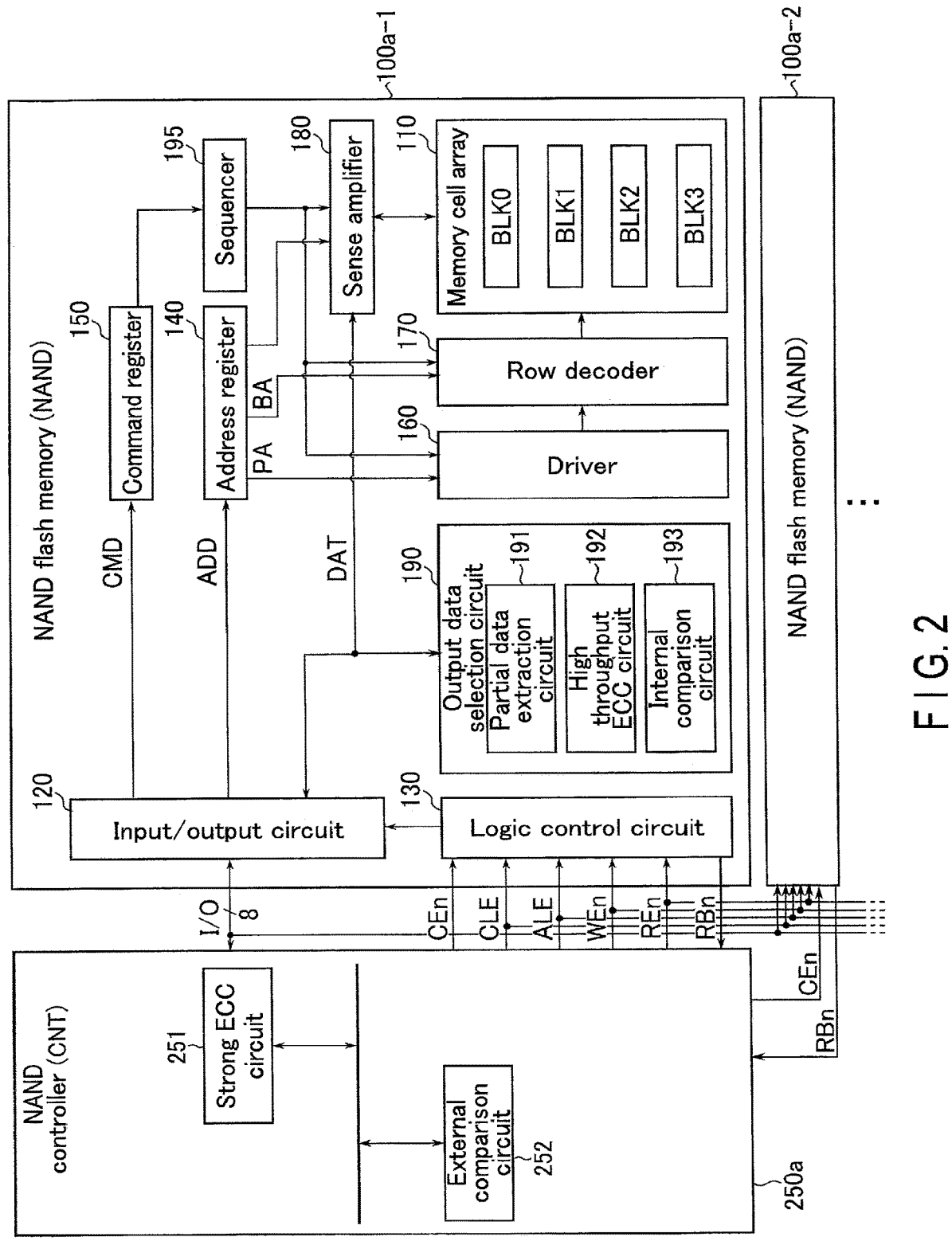
FIG. 2 is a block diagram for explaining a configuration of a NAND controller and a NAND flash memory according to the first embodiment.

FIG. 2 is a block diagram for explaining a configuration of the coupling between the NAND controller and the set of NAND flash memories according to the first embodiment. FIG. 2 shows an example of the configuration of the NAND controller 250a and one of the NAND flash memories 100 (100a-1) coupled to the NAND controller 250a, and the coupling therebetween. In FIG. 2, the configuration of the NAND controller 250a is shown as an example; however, the other NAND controllers 250b through 250d also have a configuration similar to that of the NAND controller 250a.

As shown in FIG. 2, the NAND controller 250a includes a strong ECC circuit 251 and an external comparison circuit 252. The strong ECC circuit 251 and the external comparison circuit 252 need not be provided in each of the NAND controller 250a through 250d, as long as at least one of each is provided in the memory controller 200.

The strong ECC circuit 251 performs an error detection and an error correction process on data stored in the NAND flash memory 100. In other words, the strong ECC circuit 251 generates an error correction code and provides write data with the error correction code in data writing, and decodes the error correction code in data reading, so as to detect an error bit. If an error bit is detected, the location of the error bit is specified and the error is corrected. An error correction method includes, for example, hard-decision bit decoding and soft-decision bit decoding. As hard-decision bit decoding codes used for the hard-decision bit decoding, BCH (Bose-Chaudhuri-Hocquenghem) codes or RS (Reed-Solomon) codes may be used, and as soft-decision bit decoding codes used for the soft-decision bit decoding, LDPC (low density parity check) codes may be used.

The external comparison circuit 252 is a comparison circuit provided externally to the NAND flash memory 100, determines whether or not the data read from the NAND flash memory 100 satisfies a comparison condition, and sends the comparison result to the CPU 230. The external comparison circuit 252 may set, as a predetermined comparison condition in the scan processing (which will be described later), a perfect matching condition (strict condition) for determining whether or not read data perfectly matches true data.

The NAND controller 250a configured as described above is coupled to the NAND flash memories 100a-1 through 100a-4, via the NAND bus, as described above.

Examples of the signals of the NAND interface include: a chip enable signal CEn, an address latch enable signal ALE, a command latch enable signal CLE, a write enable signal WEn, a read enable signal REn, a ready/busy signal RBn, and an input/output signal I/O.

The signal CEn is a signal that enables the NAND flash memory 100, and is asserted at an "L" (low) level. The signals CLE and ALE are signals to notify the NAND flash memory 100 that the input signals I/O to the NAND flash memory 100 are a command and an address, respectively. The signal WEn is asserted at an "L" level and used to cause the NAND flash memory 100 to take the input signal I/O therein. The signal REn is also a signal that is asserted at an "L" level and used to cause the NAND flash memory 100 to take the output signal I/O therein. The ready/busy signal RBn indicates whether the NAND flash memory 100 is in a ready state (a state where an instruction from the memory controller 200 can be received) or in a busy state (a state where an instruction from the memory controller 200 cannot be received), and the "L" level indicates a busy state. The input/output signal I/O is, for example, an 8-bit signal. The input/output signal I/O is a data entity received and transmitted between the NAND flash memory 100 and the memory controller 200, and is in turn a command CMD, an address ADD, and data DAT such as write data and read data.

The NAND controller 250a communicates, among the above-listed signals, the signal CEn and RBn to the NAND flash memories 100a-1 through 100a-4, individually. The NAND controller 250a communicates, among the above-listed signals, the signals CLE, ALE, WEn, REn, and I/O to the NAND flash memories 100a-1 through 100a-4, using a common signal line.

1.1.3 NAND Flash Memory

Next, the configuration of the NAND flash memory 100 will be described, with reference to FIG. 2. In FIG. 2, the configuration of the NAND flash memory 100a-1 is shown as an example; however, the other NAND memories 100a-2 through 100a-4, 100b-1 through 100b-4, 100c-1 through 100c-4, and 100d-1 through 100d-4 also have a configuration similar to that of the NAND flash memory 100a-1.

As shown in FIG. 2, the NAND flash memory 100 is comprised of one or more chips, and includes a memory cell array 110, an input/output circuit 120, a logic control circuit 130, an address register 140, a command register 150, a driver 160, a row decoder 170, a sense amplifier 180, an output data selection circuit 190, and a sequencer 195.

The memory cell array 110 includes a plurality of blocks ELK, which is an assembly of a plurality of nonvolatile memory cell transistors respectively associated with bit lines and word lines. A block ELK is a unit of data erasure for example. FIG. 2 shows four blocks BLK0 to BLK3, as an example.

The input/output circuit 120 sends and receives the signal I/O to and from the memory controller 200. The input/output circuit 120 transfers the address ADD and the command CMD in the signal I/O to the address register 140 and the command register 150, respectively. The input/output circuit 120 sends and receives write data and read data DAT to and from a latch circuit (not shown) in the sense amplifier 180.

The logic control circuit 130 receives the signals CEn, CLE, ALE, WEn, and REn from the memory controller 200.

The logic control circuit 130 transfers the signal RBn to the memory controller 200 to externally report the status of the NAND flash memory 100.

The address register 140 stores an address ADD received from the memory controller 200 via the input/output circuit 120. The address ADD includes a block address BA and a page address PA. The command register 150 stores a command CMD received from the memory controller 200 via the input/output circuit 120.

The driver 160 supplies a voltage to the selected block BLK via the row decoder 170 based on a page address PA in the address register 140.

The row decoder 170 selects one of the blocks BLK0 to BLK3 based on a block address BA in the address register 140, and further selects a word line in the selected block BLK.

In a data write process, the latch circuit in the sense amplifier 180 transfers write data DAT received from the memory controller 200 to the memory cell array 110. In a data read process, the sense amplifier 180 senses threshold voltages of the memory cell transistors in the memory cell array 110, and outputs read data DAT based on a result of the sensing to the memory controller 200 via the latch circuit in the sense amplifier 180. The sense amplifier 180 may selectively output a part of the read data DAT selected by the output data selection circuit 190, among the read data DAT. The sense amplifier 180 may temporarily store the read data DAT in the latch circuit to communicate with the output data selection circuit 190. The output selection circuit 190 receives the read data DAT from the sense amplifier 180, and selects data to be output to the memory controller 200 from the read data DAT. Specifically, the output data selection circuit 190 includes a partial data extraction circuit 191, a high throughput ECC circuit 192, and an internal comparison circuit 193.

The partial data extraction circuit 191 extracts data in a minimum unit processible by the high throughput ECC circuit 192 (partial data) from the read data DAT.

The high throughput ECC circuit 192 has a function of decoding data decoded by the above-described strong ECC circuit 251. The high throughput ECC circuit 192 is an ECC circuit configured to be operable in the decoding process at a higher throughput than that of the strong ECC 251. The correction ability of the high throughput ECC circuit 192 may be lower than that of the strong ECC circuit 251. For example, the high throughput ECC circuit 192 may include a configuration capable of performing hard decision decoding but may not necessarily include a configuration capable of performing soft decision decoding. Thus, as the high throughput ECC circuit 192 is allowed to have more failures in correction than the strong ECC circuit 251 is, the high throughput ECC circuit 192 may operate at a high rate.

The internal comparison circuit 193 is a comparison circuit provided inside the NAND flash memory 100, and may have a function equivalent to an external comparison circuit 252, for example. The internal comparison circuit 193 determines whether or not the partial data for which error correction has been performed by the high throughput ECC circuit 192 satisfies the predetermined comparison condition, and sends a result of the comparison to the sense amplifier 180. The internal comparison circuit 193 is configured to be able to set the comparison condition used for the above-described internal comparison processing in accordance with an instruction from the memory controller 200.

The sequencer 195 controls the operation of the entire NAND flash memory 100 based on the command CMD held in the command register 150.

1.1.4 Memory Cell Array

Figure 3:
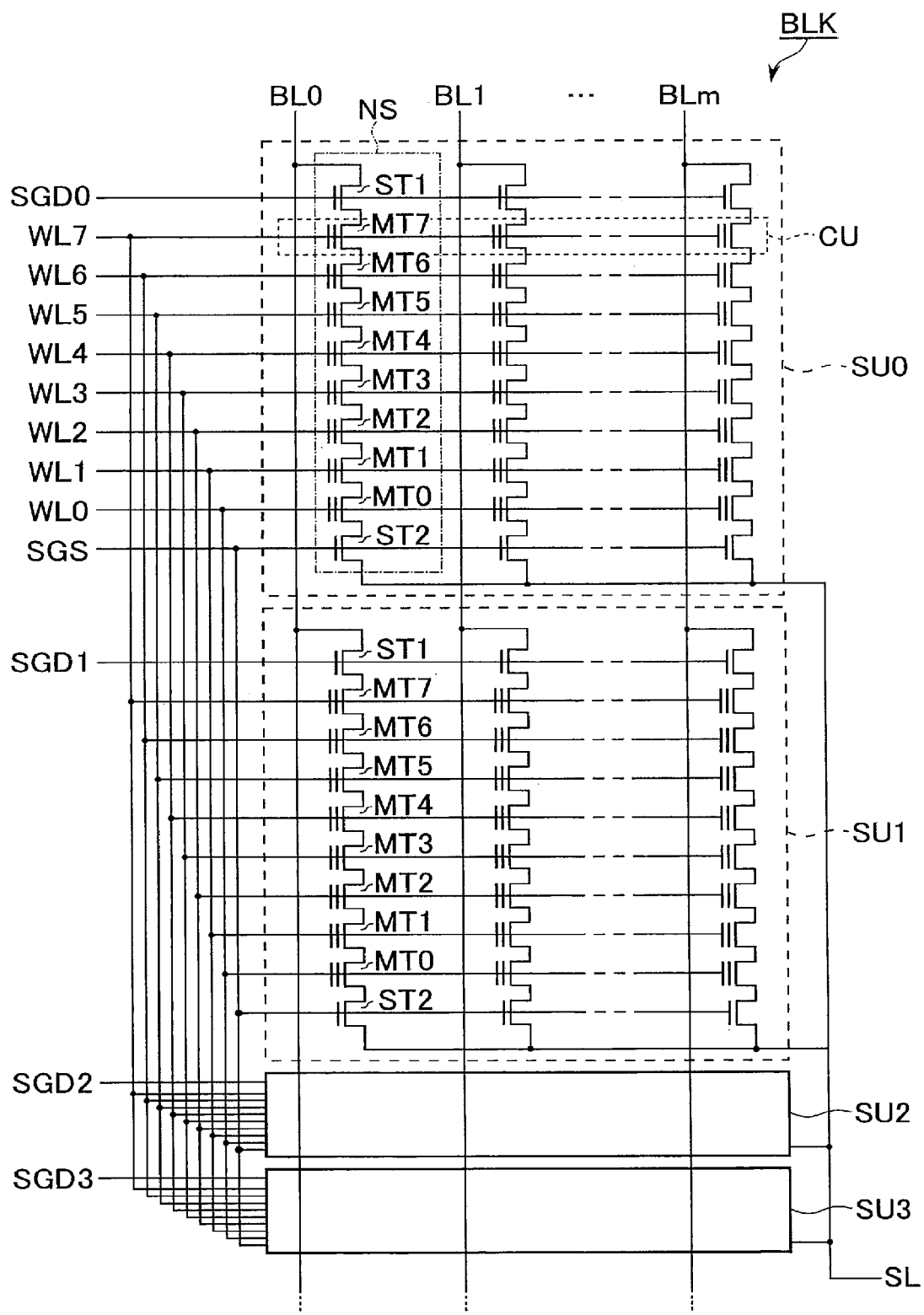
FIG. 3 is a circuit diagram for explaining a configuration of a memory cell array according to the first embodiment.

FIG. 3 is a circuit diagram for explaining a configuration of a memory cell array according to the first embodiment.

In FIG. 3, one block BLK of a plurality of blocks BLK included in the memory cell array 110 is shown.

As shown in FIG. 3, the block BLK includes, for example, four string units SU (SU0 to SU3). Each string unit SU includes a plurality of NAND strings NS that are respectively associated with bit lines BL0 to BLm (m is an integer greater than 1). Each NAND string NS includes, for example, eight memory cell transistors MT0 to MT7 and select transistors ST1 and ST2. Each memory cell transistor MT includes a control gate and a charge storage layer, and stores electric charge (electrons) corresponding to data in a nonvolatile manner. Each of the select transistors ST1 and ST2 is used to select a string unit SU at the time of performing various operations.

In each NAND string NS, memory cell transistors MT0 to MT7 are coupled in series. The drain of the select transistor ST1 is coupled to an associated bit line BL, and the source of the select transistor ST1 is coupled to one end of the memory cell transistors MT0 through MT7, which are coupled in series. The drain of the select transistor ST2 is coupled to the other ends of the memory cell transistors MT0 through MT7, which are coupled in series. The source of the select transistor ST2 is coupled to the source line SL.

The control gates of the memory cell transistors MT0 through MT7 in the same block BLK are respectively coupled to word lines WL0 through WL7. The gates of select transistors ST1 respectively included in the string units SU0 through SU3 are respectively coupled in common to select gate lines SGD0 through SGD3. The gates of the select transistors ST2 are coupled in common to the select gate line SGS.

In other words, the block ELK is an assembly of the string units SU sharing the word lines WL0 through WL7. A block ELK is a unit of data erasure for example. In other words, data stored in memory cell transistors MT included in a same block ELK is erased in a batch.

In other words, a string unit SU is a group of a plurality of NAND strings NS coupled to respective bit lines BL and coupled to the same select gate line SGD. In a string unit SU, a group of memory cell transistors MT coupled in common to the same word line WL may also be called a "cell unit CU". For example, a group of same-level bits stored in the plurality of memory cell transistors MT in the cell unit CU is defined as "one page". The cell unit CU may have a storage capacity of two or more pages in accordance with the number of bits of data stored in the memory cell transistors MT.

The above-described circuit configuration of the memory cell array 110 is not limited to the above-described one. For example, the number of the memory cell transistors MT and the number of the select transistors ST1 and ST2 included in each NAND string NS may be determined as appropriate. The number of string units SU included in each block BLK may be determined as appropriate.

1.1.5 Page Data

Next, the details of data for one page stored in a cell unit CU will be described with reference to the schematic diagram of FIG. 4.

Figure 4:
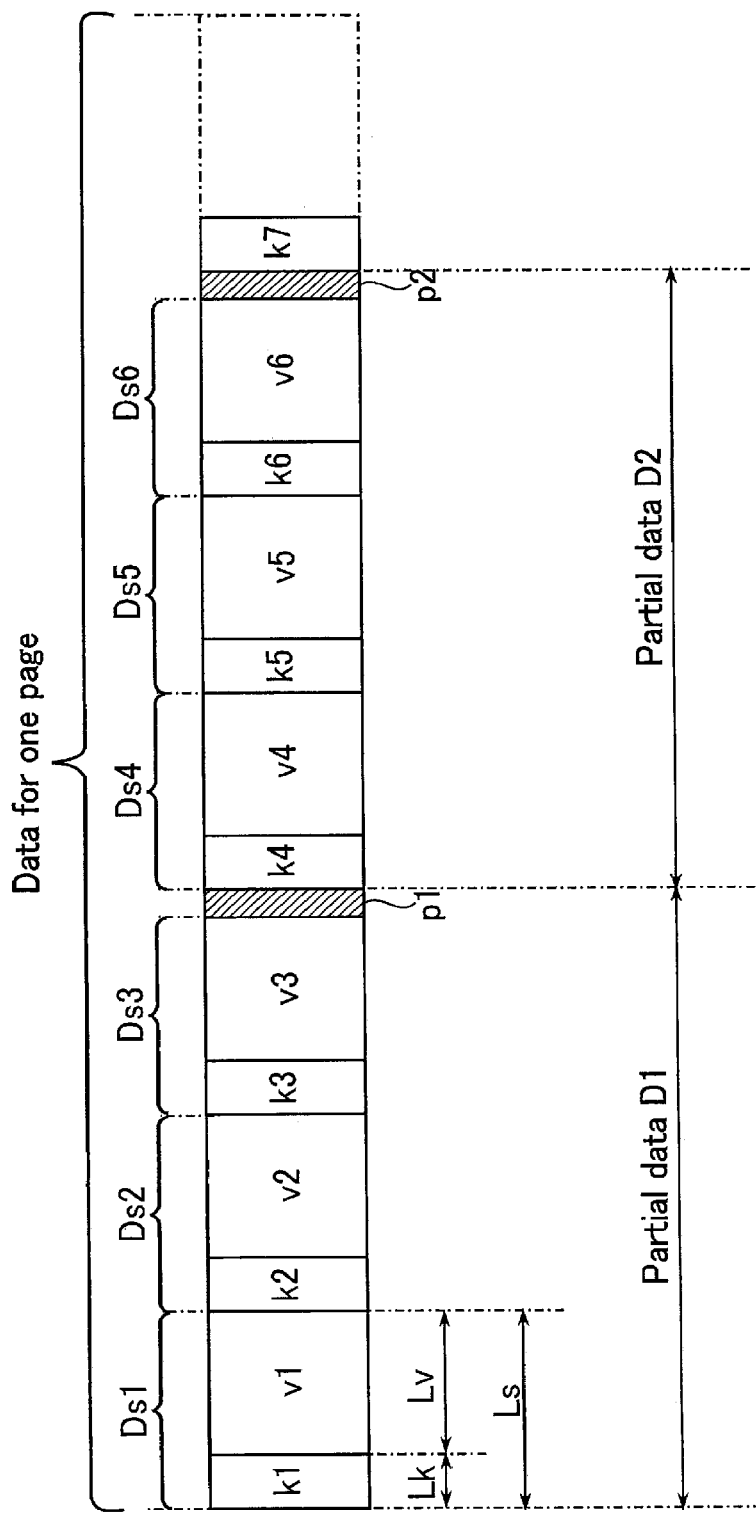
FIG. 4 is a schematic diagram for explaining a configuration of page data according to the first embodiment.

As shown in FIG. 4, data for one page includes multiple sets of partial data D (D1, D2, . . . ). Partial data D is a minimum unit for which error detection process and error correction process are performed by the high throughput ECC circuit 192 and the strong ECC circuit 251. The same data length is assigned to each of the sets of partial data D.

In the example shown in FIG. 4, the partial data D1 includes three data sets, Ds1, Ds2, and Ds3, and a parity p1, for example. The partial data D2 includes three data sets, Ds4, Ds5, and Ds6, and a parity p2, for example. The data set Ds includes a set of a key k and a value v which are mutually associated.

In the key k, a value for identifying an attribute of the value v is stored, for example. The method of storing the data set Ds constituting the mutually associated key k and value v in the memory cell array 110 may be called a "KVS (key-value store)".

The same data length Lk is assigned to all the keys k, and the same data length Lv is assigned to all the values v. In other words, in the example shown in FIG. 4, the data length Ls between two adjacent keys k is Ls=Lk+Lv. The data length Lk may be called "key length Lk", and the data length Ls may be called "stride length Ls".

The parity p is generated by the memory controller 200, for example, and includes error detection coding, such as check sum and CRC (cyclic redundancy check), or error correction coding, such as hard-decision decoding or soft-decision decoding.

1.2 Operation

Next, an operation of the memory system according to the first embodiment will be described.

1.2.1 Scan Processing

Next, the scan processing in the memory system according to the first embodiment will be described with reference to the flowchart of FIG. 5.

Figure 5:
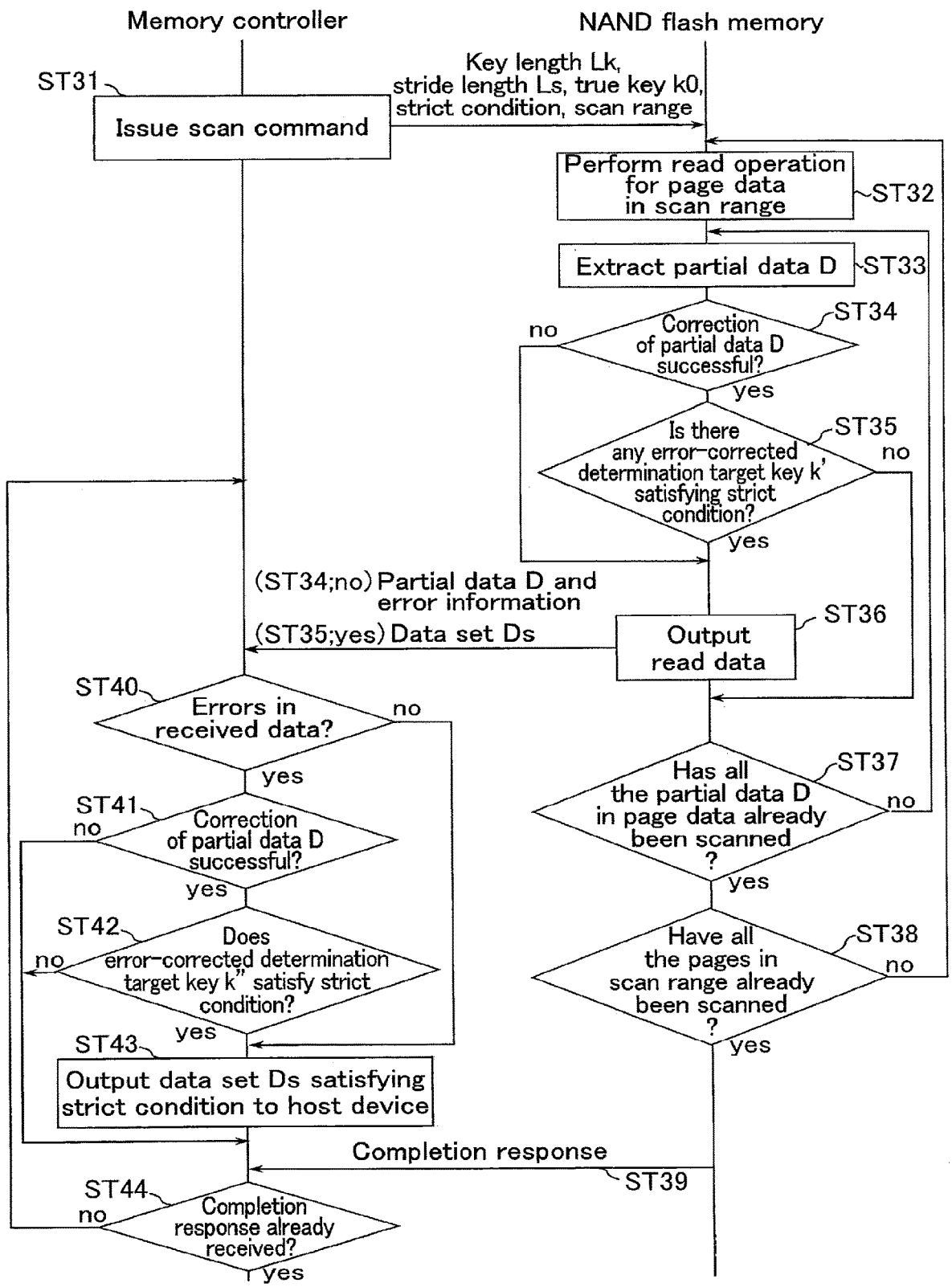
FIG. 5 is a flowchart for explaining scan processing in the memory system according to the first embodiment.

As shown in FIG. 5, in step ST31, the memory controller 200 issues a scan command and transmits it to the NAND flash memory 100. The scan command includes a key length Lk, a stride length Ls, a true key k0, a strict condition, and a scan range.

More specifically, for example, the memory controller 200 first sends a command XXh and data DAT of multiple cycles. The command XXh is a command for instructing performance of scan processing. The data DAT subsequent to the command XXh may include the key length Lk, the stride length Ls, the true key k0, and the strict condition. The strict condition may include, for example, information indicating that a comparison target perfectly matches the true key k0. The strict condition is not limited to the perfect match comparison using the true key k0, and it may be a perfect match comparison using the true key0 with a part of the key k stored in the NAND flash memory 100, an inequality comparison using the true key k0, or a combination thereof.

Subsequently, the memory controller 200 sends a command 00h, an address ADD over multiple cycles, and a command 30h. The command 00h is a command for instructing performance of a read process, and the address ADD subsequent to the command 00h may include the scan range. The command 30h is a command for instructing performance of a read operation for data based on the address ADD sent immediately before the command. The NAND flash memory 100 is prompted to commence scan processing by the scan command including such a sequence.

The processing in the NAND flash memory 100 (steps ST32 through ST39) after the scan command is issued will be described.

In step ST32, the NAND flash memory 100 performs reading of page data within the scan range. The sense amplifier 180 reads the page data from the memory cell array 110, and stores the page data in the latch circuit of the sense amplifier 180.

In step ST33, the partial data extraction circuit 191 extracts partial data D including determination target keys k from the page data read in step ST32.

In step ST34, the high throughput ECC circuit 192 performs error detection and error correction based on the parity p in the partial data D extracted in step ST33. If the correction of the partial data D is successful (Yes in step ST34), the processing in the NAND flash memory 100 proceeds to step ST35; if the correction fails (No in step ST34), the processing in the NAND flash memory 100 omits step ST35 and proceeds to step ST36.

In step ST35, the internal comparison circuit 193 determines whether or not any error-corrected determination target key k' satisfying the strict condition included in the scan command is present in the partial data D. Specifically, the internal comparison circuit 193 retrieves all the error-corrected determination target keys k' from the partial data D based on their key lengths Lk and stride lengths Ls, and determines, for example, whether or not the error-corrected determination target keys k' perfectly match the true key k0. If there is an error-corrected determination target key k' satisfying the strict condition (Yes in step ST35), the processing in the NAND flash memory 100 proceeds to step ST36; if any error-corrected determination target key k' does not satisfy the strict condition (No in step ST35), the processing in the NAND flash memory 100 omits step ST36 and proceeds to step ST37. In step ST35, all the data sets Ds corresponding to the error-corrected determination target keys k' satisfying the strict condition in the partial data D are selected as output data in later-described step ST36.

By foregoing steps ST33 through ST35, the selection (scanning) of output data to a single set of partial data D by the output data selection circuit 190 is finished.

In step ST36, of the page data stored in the latch circuit in step ST32, the NAND flash memory 100 outputs read data, which is a target for output, to the memory controller 200.

Specifically, if the error detection and error correction fail in step ST34 (No in step ST34), the NAND flash memory 100 sends to the memory controller 200 the partial data D for which the error detection and error correction have failed, and error information based on the error detection and error correction. The error information includes information indicating whether or not there is an error in the partial data D sent together with the error information itself.

If it is determined that the strict condition is satisfied in step ST35 (Yes in step ST35), the NAND flash memory 100 selectively sends to the memory controller 200 all the data sets Ds including the error-corrected determination target key k' satisfying the strict condition.

In step ST37, the NAND flash memory 100 determines whether or not all items of partial data D in the page data read in step ST32 have been scanned. If there is partial data D that has not been scanned (No in step ST37), the processing in the NAND flash memory 100 returns to step ST33. Thus, steps ST33 through ST36 are repeated until the scanning of all items of the partial data D in the page data is finished. If all items of the partial data D have been scanned (Yes in step ST37), the processing in NAND flash memory 100 proceeds to step ST38.

If there are multiple data sets Ds that each include the key k satisfying the strict condition in data for one page, the NAND flash memory 100 may output the multiple data sets Ds to the memory controller 200 in step ST36, separately or collectively.

In step ST38, the NAND flash memory 100 determines whether or not all the pages in the scan range designated in the scan command have been scanned. If there are not-scanned pages (No in step ST38), the processing in the NAND flash memory 100 returns to step ST32. Thus, steps ST32 through ST37 are repeated until the scanning of all sets of the partial data D in the page data is finished. If all page data has been scanned (Yes in step ST38), the processing in the NAND flash memory 100 proceeds to step ST39.

Instead of proceeding to step ST32 after step ST38, the NAND flash memory 100 may perform the processing of step ST32 in the background of the processing of steps ST33 to ST38. In this case, processing time in the NAND flash memory 100 can be reduced.

In step ST39, the NAND flash memory 100 sends, to the memory controller 200, a completion response reporting that the scan processing has been completed for all page data in the scan range. Thus, the scan processing in the NAND flash memory 100 is finished.

Next, the processing in the memory controller 200 (step ST40 through step ST44) after the scan command is issued will be described.

When the memory controller 200 is received the partial data D or the data set Ds in step ST36, the processing in the memory controller 200 proceeds to step ST40.

In step ST40, the memory controller 200 determines whether or not the read data received from the NAND flash memory 100 contains errors based on whether or not error information is received in step ST36. If there are errors (Yes in step ST40), the processing in the memory controller 200 proceeds to step ST41, and if there are no errors (No in step ST40), the processing in the memory controller 200 proceeds to step ST43.

In step ST41, the strong ECC circuit 251 performs error detection and error correction based on the parity p in the partial data D received in step ST36. If the correction of the partial data D is successful (Yes in step ST41), the processing in the memory controller 200 proceeds to step ST42; if the correction fails (No in step ST41), the memory controller 200 determines it to be an ECC failure, and proceeds to step ST44. In the case of an ECC failure, the host apparatus 300 may be notified of the ECC failure by the memory controller 200, for example.

As described above, the error detection and error correction by the strong ECC circuit 251 includes processing based on a method with a high error correction ability, such as the soft-decision decoding. For this reason, at the time when the processing proceeds to step ST42, the memory controller 200 stores partial data D that may include an error, and partial data ^D in which the error in the partial data D has been perfectly corrected.

In step ST42, the external comparison circuit 252 in the memory controller 200 determines whether or not the error-corrected determination target key k'' satisfies the strict condition with respect to the true key k0. Specifically, the external comparison circuit 252 determines whether or not the true key k0 perfectly matches the error-corrected determination target key k''. If the strict condition is satisfied (Yes in step ST42), the processing in the memory controller 200 proceeds to step ST43; if the strict condition is not satisfied (No in step ST42), the processing in the memory controller 200 omits step ST43 and proceeds to step ST44.

In step ST43, the memory controller 200 outputs, to the host apparatus 300, a data set Ds that includes the determination target key k" which has been determined to satisfy the strict condition in step ST42, or a data set Ds that includes the determination target key k' which has been determined to satisfy the strict condition in step ST35.

In step ST44, the memory controller 200 determines whether or not the completion response of the scan processing has already been received from the NAND flash memory 100. If the completion response has not yet been received (No in step ST44), the processing returns to step ST40. Thus, the memory controller 200 repeats the processing in step ST40 through step ST43 until the completion response is received. If the completion response has already been received (Yes in step ST44), the memory controller 200 determines that all the data sets Ds including the key k that matches the true key k0 in the scan range have been output to the host apparatus 300, and finishes the scan processing.

1.3 Advantageous Effects of First Embodiment

According to the first embodiment, the NAND flash memory 100 reads page data upon receipt of the scan command from the memory controller 200. The partial data extraction circuit 191 extracts partial data D including a determination target key k from the page data. The high throughput ECC circuit 192 performs error correction on the extracted partial data D. The internal comparison circuit 193 determines whether or not the error-corrected determination target key k' satisfies the strict condition with respect to the true key k0. Then, the NAND flash memory 100 outputs, to the memory controller 200, the data set Ds including the error-corrected determination target key k' satisfying the strict condition and the partial data D including the determination target key k for which the error correction has failed. Thus, a part of the selection process of data that should be ultimately output to the host apparatus 300 by the memory controller 200 can be borne by the NAND flash memory 100. Specifically, among multiple pieces of partial data D for which the error correction has been successful, the NAND flash memory 100 removes any partial data D that does not include the determination target key k' satisfying the strict condition from the target for output to the memory controller 200. Thus, data that should be output from the memory cell array 110 to the memory controller 200 can be narrowed down by the selection process. It is thus possible to suppress an increase in an amount of data communicated between the NAND flash memory 100 and the memory controller 200, and to suppress, in turn, an increase in power consumption required for data communication between the NAND flash memory 100 and the memory controller 200.

Specifically, although the high throughput ECC circuit 192 does not have a higher correction ability compared to the strong ECC circuit 251 in the memory controller 200, the high throughput ECC circuit 192 has a higher throughput than that of the strong ECC circuit 251. It is thus possible to perform error correction without increasing a load in terms of time required for the scan processing in the NAND flash memory 100.

Furthermore, the internal comparison circuit 193 determines whether or not the determination target key k' perfectly matches the true key k0. It is thus possible to select, on the assumption that errors are not included in determination target keys k', a determination target key k' that matches the true key k0 as output data, and exclude a determination target key k' that does not match a true key k0 from the target of output.

The memory controller 200 transmits, to the NAND flash memory 100, a command set that includes a key length Lk, a stride length Ls, a true key k0, a strict condition, and a scan range. It is thus possible for the partial data extraction circuit 191 to accurately grasp the address of a determination target key k in page data. The internal comparison circuit 193 can determine partial data D to be output to the memory controller 200 in accordance with the strict condition designated by the memory controller 200.

The strong ECC circuit 251 of the memory controller 200 performs an error correction with a higher error correction ability than that of the high throughput ECC circuit 192 on the partial data D output from the NAND flash memory 100 and failed the error correction by the high throughput ECC circuit 192. It is thus possible for the external comparison circuit 252 to determine whether or not a determination target key k" perfectly matches a true key k0, and can determine data to be ultimately output to the host apparatus 300.

1.4 Modifications of First Embodiment

The first embodiment is not limited to the above-described example, and various modifications can be made thereto. Hereinafter, the same configurations and operations as those of the first embodiment will be omitted, and mainly those differing from those of the first embodiment will be described.

1.4.1 First Modification of First Embodiment

For example, the example where the high throughput ECC circuit 192 performs an error correction is described in the first embodiment; however, the first embodiment is not limited thereto. For example, the high throughput ECC circuit 192 may select a determination target key k for which internal comparison processing is to be performed by the internal comparison circuit 193, through performing an error detection, without performing an error correction.

Figure 6:
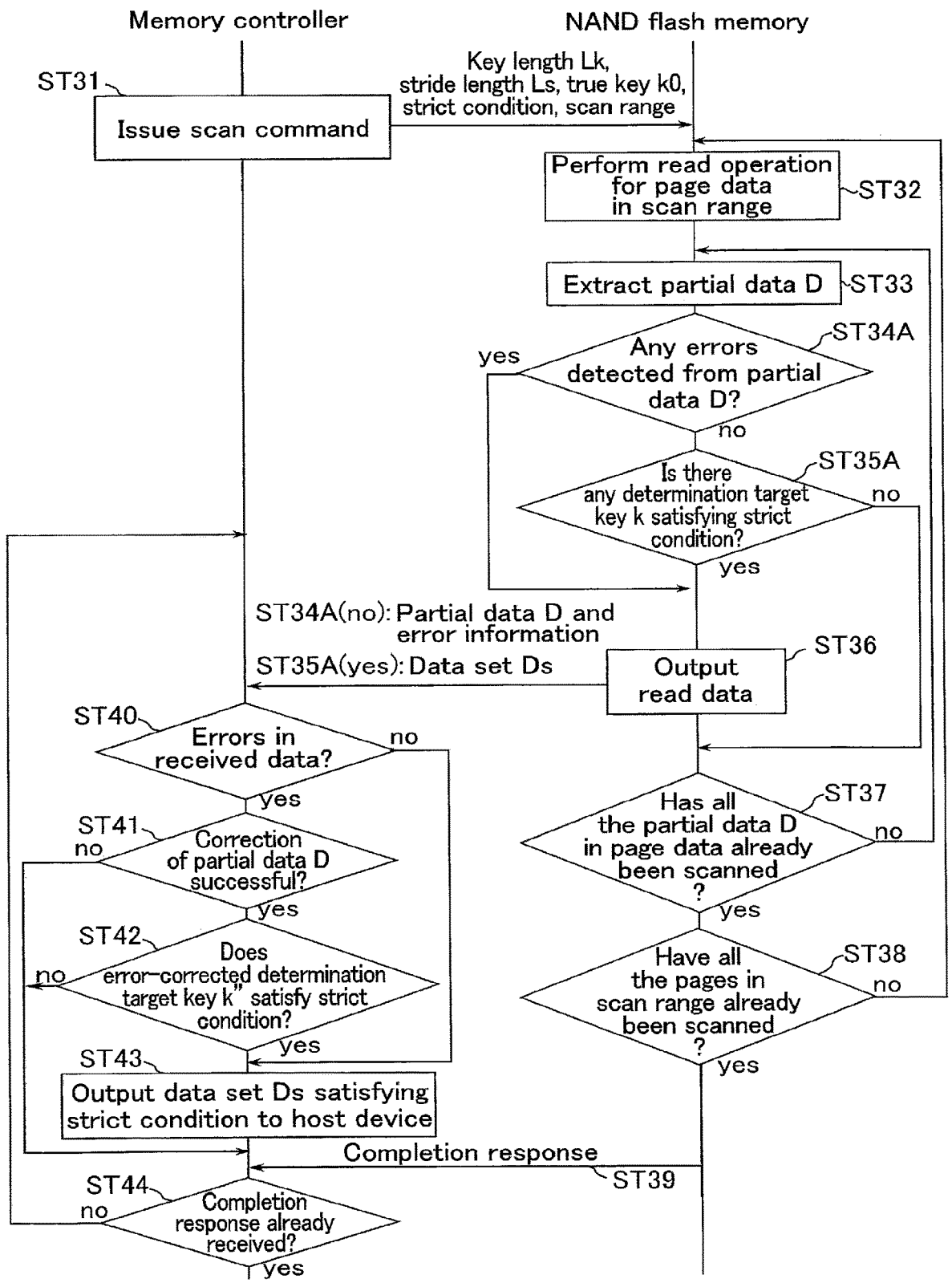
FIG. 6 is a flowchart for explaining scan processing in the memory system according to a first modification of the first embodiment.

FIG. 6 is a flowchart for explaining scan processing in the memory system according to the first modification of the first embodiment. FIG. 6 corresponds to FIG. 5 in the first embodiment, and shows an example where steps ST34A and ST35A are performed instead of steps ST34 and ST35 shown in FIG. 5.

As shown in FIG. 6, since steps ST31 through ST33 are equivalent to those in the first embodiment, the description thereof is omitted.

In step ST34A, the high throughput ECC circuit 192 performs an error detection without performing an error correction on the partial data D, and determines whether or not an error is detected from the partial data D. The error detection includes CRC and a check sum calculation, for example. As a result of the determination, if no errors are detected in the partial data D (No in step ST34A), the processing proceeds to step ST35A; if errors are detected (Yes in step ST34A), the processing omits step ST35A and proceeds to step ST36.

In step ST35A, the internal comparison circuit 193 determines whether or not the determination target key k satisfying the strict condition is present in the partial data D. As a result of the determination, if there is any determination target key k satisfying the strict condition in the partial data D (Yes in step ST35A), the processing proceeds to step ST36; if all the determination target keys k in the partial data D do not satisfy the strict condition (No in step ST35A), the processing proceeds to step ST37. In step ST35A, all data sets Ds corresponding to the determination target key k' satisfying the strict condition in the partial data D are selected as output data in later-described step ST36.

Since the processing in step ST36 and thereafter is the same as that in the first embodiment, description is omitted. However, the processing in step ST36 is not limited to that in the first embodiment. For example, if there is any determination target key k satisfying the strict condition in the partial data D (Yes in step ST35A), in step ST36, the NAND flash memory 100 may output the partial data D in order to perform error detection by the strong ECC circuit 251 in the memory controller 200.

Through the above-described operation, the speed of the scan processing in the NAND flash memory 100 can be enhanced.

1.4.2 Second Modification of First Embodiment

In the above-described first embodiment, the example where data to be ultimately output to the host apparatus 300 by the external comparison circuit 252 in the memory controller 200 is described; however, the first embodiment is not limited thereto.

Figure 7:
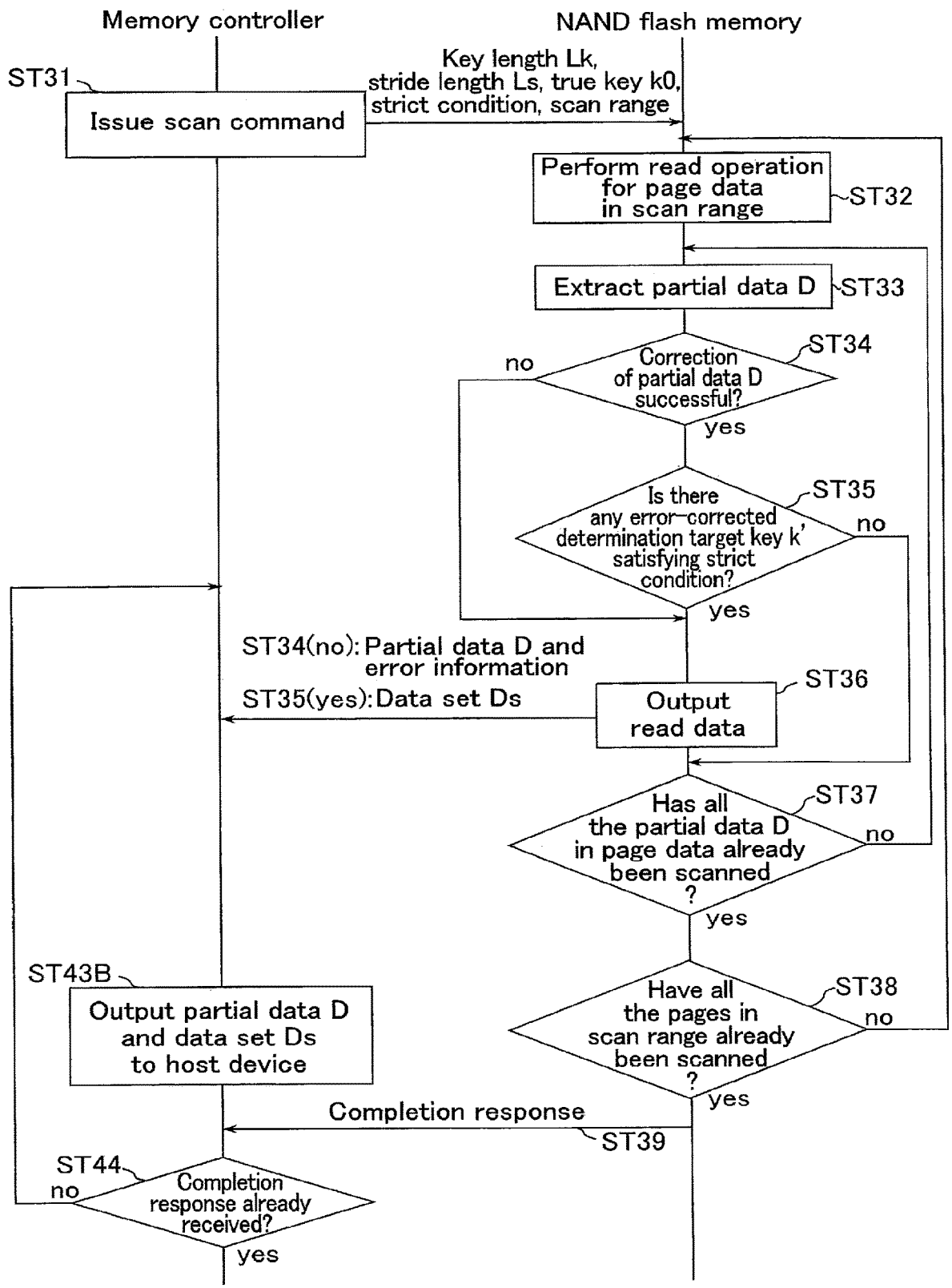
FIG. 7 is a flowchart for explaining scan processing in the memory system according to a second modification of the first embodiment.

FIG. 7 is a flowchart for explaining the scan processing in the memory system according to the second modification of the first embodiment. FIG. 7 corresponds to FIG. 5 illustrating the first embodiment, and shows an example where steps ST40 through ST42 shown in FIG. 5 are omitted and step ST43B is performed instead of step ST43.

As shown in FIG. 7, since steps ST31 through ST39 are equivalent to those in the first embodiment, the description thereof is omitted.

In step ST43B, upon receipt of the partial data D or the data sets Ds from the NAND flash memory 100, the memory controller 200 outputs the partial data D or the data sets Ds to the host apparatus 300, without performing error correction or the strict-condition determination on the partial data D.

Through the above operation, the memory controller 200 outputs all pieces of partial data D for which the error correction has failed and all data sets Ds satisfying the strict condition to the host apparatus 300, without selecting data to be output from itself to the host apparatus 300. Thus, it is possible to suppress an increase in an amount of communication between the NAND flash memory 100 and the memory controller 200 even in the case where the host apparatus 300 is configured to be able to perform the error correction and the strict condition determination internally.

2. Second Embodiment

Next, the memory system according to the second embodiment will be described. In the first embodiment, the case where the data size for which error detection and error correction are performed in the strong ECC circuit 251 matches that in the high throughput ECC circuit 192 is described. In the second embodiment, the data size for which error detection and error correction are performed in the strong ECC circuit 251 differs from that in the high throughput ECC circuit 192. Hereinafter, the same configurations and operations as those of the first embodiment will be omitted, and mainly those differing from those of the first embodiment will be described.

2.1 Page Data

Figure 8:
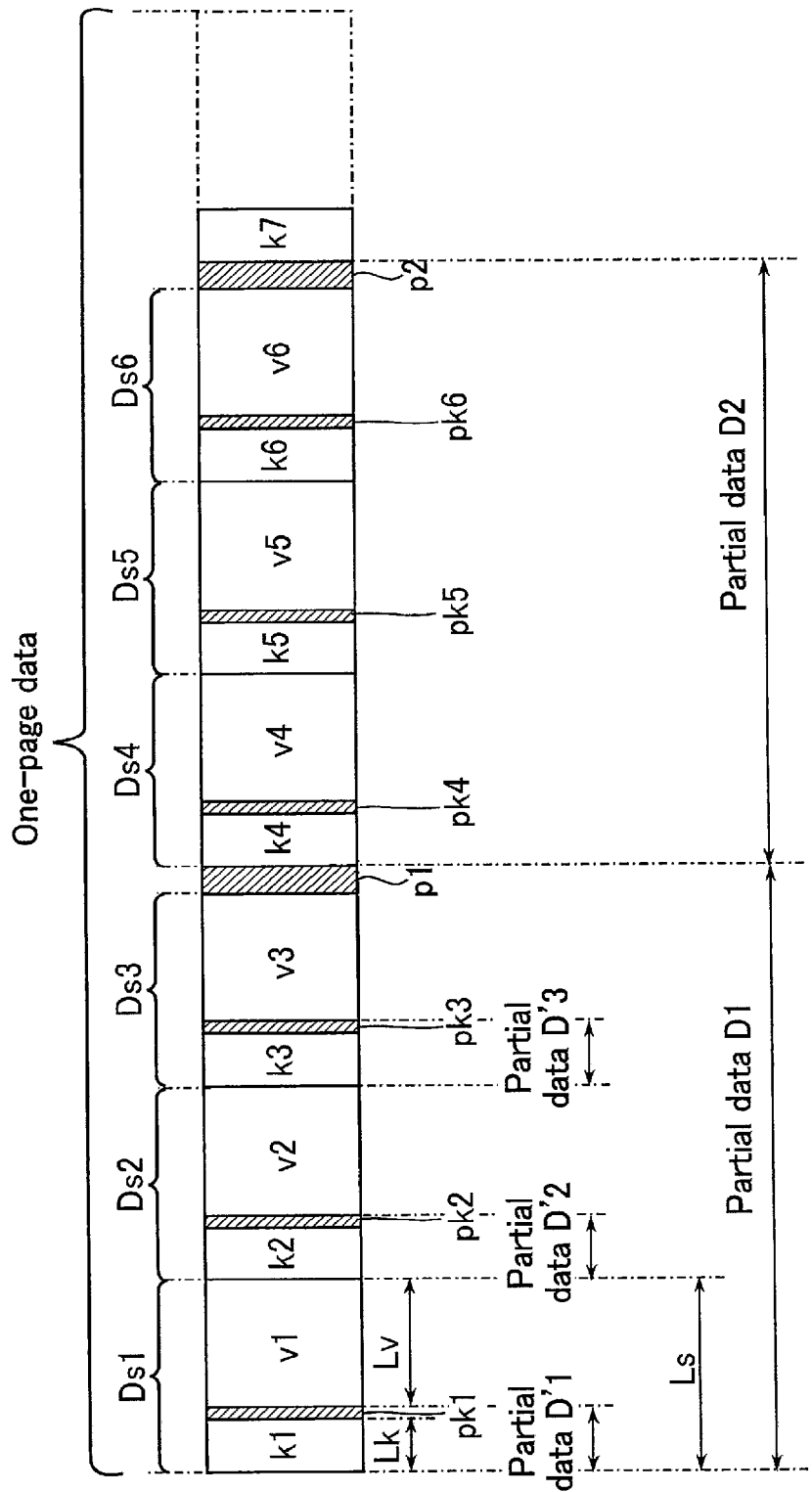
FIG. 8 is a schematic diagram for explaining a configuration of page data according to a second embodiment.

FIG. 8 is a schematic diagram for explaining page data stored in the memory cell array according to the second embodiment, and corresponds to FIG. 4 in the first embodiment.

As shown in FIG. 8, the partial data D1 includes a set of partial data D'1 and value v1, a set of partial data D'2 and value v2, a set of partial data D'3 and value v3. Partial data D' is a minimum unit for which error detection and error correction are performed by the high throughput ECC circuit 192. Specifically, the partial data D'1 through D'3 include a set of key k1, parity pk1, a set of key k2 and parity pk2, and a set of key k3 and parity pk3, respectively. In other words, the high throughput ECC circuit 192 can skip the error detection and the error correction for the values v, and can perform the error detection and the error correction for the key k by using its corresponding parity pk. Similarly to the parity p, the parity pk may be generated by, for example, the memory controller 200, or may be generated within an upper device of the memory controller 200, such as the host apparatus 300, or a device subordinate to the memory controller 200, such as the NAND flash memory 100.

With the above-described configuration, in the scan processing, the high throughput ECC circuit 192 is able to selectively perform error detection and error correction on the partial data D' having a data size smaller than that of the partial data D.

2.2 Operation

Next, an operation in the memory system according to the second embodiment will be described.

2.2.1 Patrol Processing

In the second embodiment, patrol processing is performed targeting the keys k, in addition to regular patrol processing. The patrol processing is periodical processing by the memory controller 200 to check whether or not data stored in the NAND flash memory 100 can be correctly read. The patrol processing includes a read process that the memory controller 200 instructs the NAND flash memory 100 to perform, and a write process in which the memory controller 200 instructs the NAND flash memory 100 to rewrite data if data cannot be correctly read by the foregoing read process. The patrol processing may be, for example, periodically performed by the memory controller 200, without receiving an instruction from the host apparatus 300. In the present embodiment, the memory system 1 maintains the number of error bits included in the keys k to be lower than a predetermined threshold in the patrol processing targeting the keys k. In the description hereinafter, for the sake of explanation, the patrol processing targeting the keys k will be simply referred to as "patrol processing".

The patrol processing in the memory system according to the second embodiment will be described with reference to the flowchart of FIG. 9.

Figure 9:
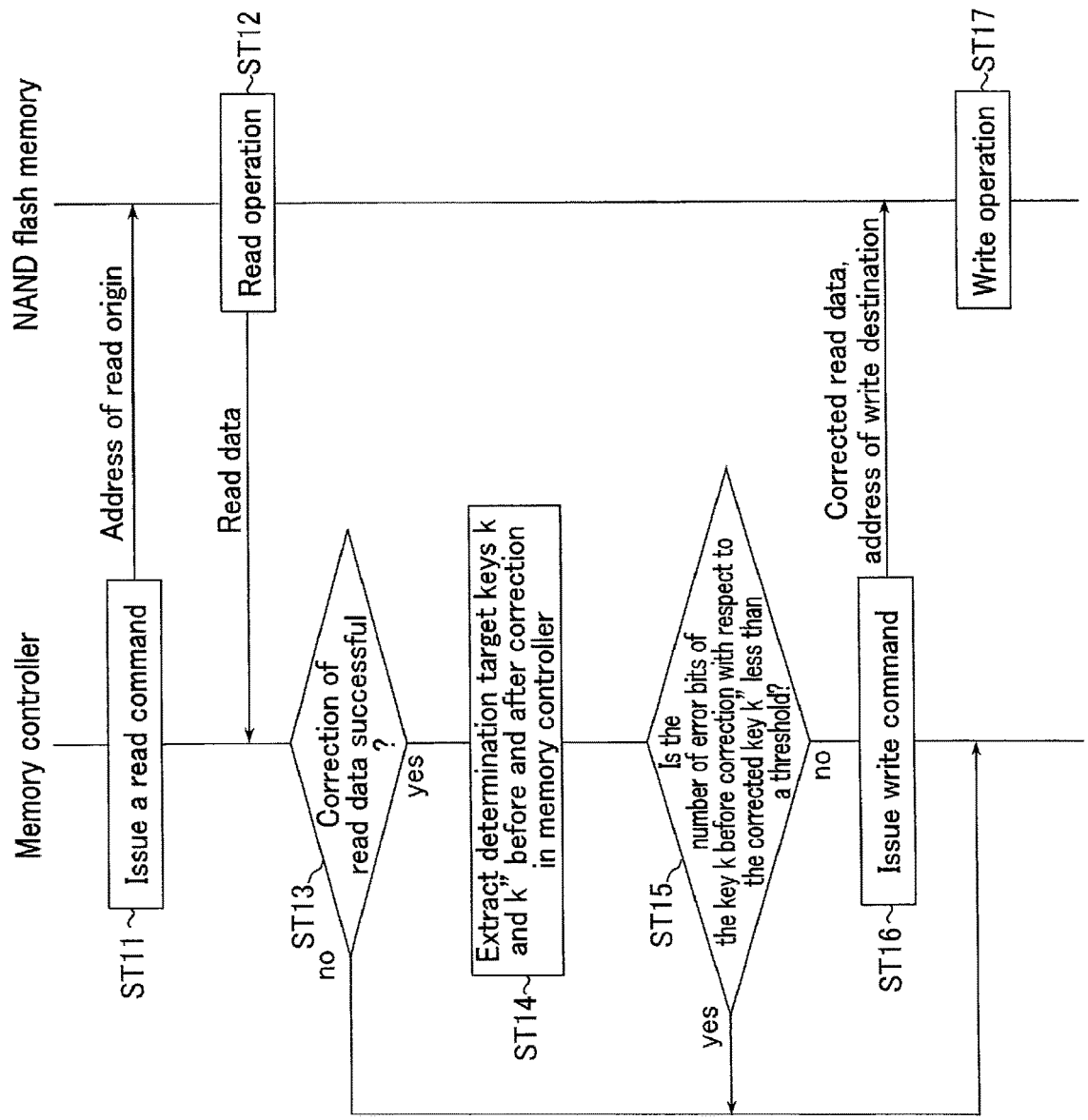
FIG. 9 is a flowchart for explaining patrol processing in a memory system according to the second embodiment.

As shown in FIG. 9, in step ST11, the memory controller 200 issues a read command, and sends it to the NAND flash memory 100. The read command includes address information of the origin of the read data. Since the patrol processing is periodically performed by the memory controller 200 as described above, the memory controller 200 issues a read command regardless of an instruction from the host apparatus 300.

In step ST12, the NAND flash memory 100 performs a read process upon receipt of the read command. The NAND flash memory 100 reads, from the memory cell array 110, read data corresponding to the address information in the read command, and outputs the read data to the memory controller 200.

In step ST13, the strong ECC circuit 251 in the memory controller 200 performs error detection and error correction on the read data. If the error correction is successful (Yes in step ST13), the processing proceeds to step ST14; if the correction fails (No in step ST13), the memory controller 200 determines it to be an ECC failure and notifies the host apparatus 300 of the information, and finishes the patrol processing.

As described above, the error detection and error correction by the strong ECC circuit 251 includes processing based on a method with a higher error correction ability than that of the hard-decision decoding, such as soft-decision decoding.

For this reason, at the time when the processing proceeds to step ST14, the memory controller 200 stores the read data that may include an error and the read data in which the error in the partial data has been perfectly corrected.

In step ST14, the memory controller 200 extracts a key (determination target key) k targeted for the external comparison processing by the external comparison circuit 252 from the pre-correction read data. The memory controller 200 also extracts a determination target key k" corresponding to the determination target key k from the corrected read data.

In step ST15, the external comparison circuit 252 in the memory controller 200 determines whether or not the number of error bits in the pre-correction determination target key k corresponding to the corrected determination target key k" is less than a threshold. If the number of error bits is less than the threshold (Yes in step ST15), the patrol processing is finished; if the number of error bits is equal to or greater than the threshold (No in step ST15), the processing proceeds to step ST16.

The predetermined threshold may be a value equal to or smaller than an upper limit value of the number of bits for which errors are correctable by the high throughput ECC circuit 192, for example.

In step ST16, the memory controller 200 issues a write command, and sends it to the NAND flash memory 100. The write command includes corrected read data corrected in step ST13 and address information of the write destination.

In step ST17, the NAND flash memory 100 performs a write process upon receipt of the write command. The write destination address designated by the write command may be the same as or different from the address designated as the origin of data in step ST11. If the read origin address and the write destination address are the same, however, a write process is performed after data stored in a block BLK that includes the memory area is erased.

Through the above-described operation, when the determination target key k in the read data contains many errors that cannot be corrected by the high throughput ECC circuit 192, the read data is rewritten in the NAND flash memory 100 by the data for which errors are corrected by the strong ECC circuit 251. It is thus possible to maintain the keys k in the NAND flash memory 100 in such a state that the high throughput ECC circuit 192 can correct the keys k.

2.2.2 Scan Processing

Figure 10:
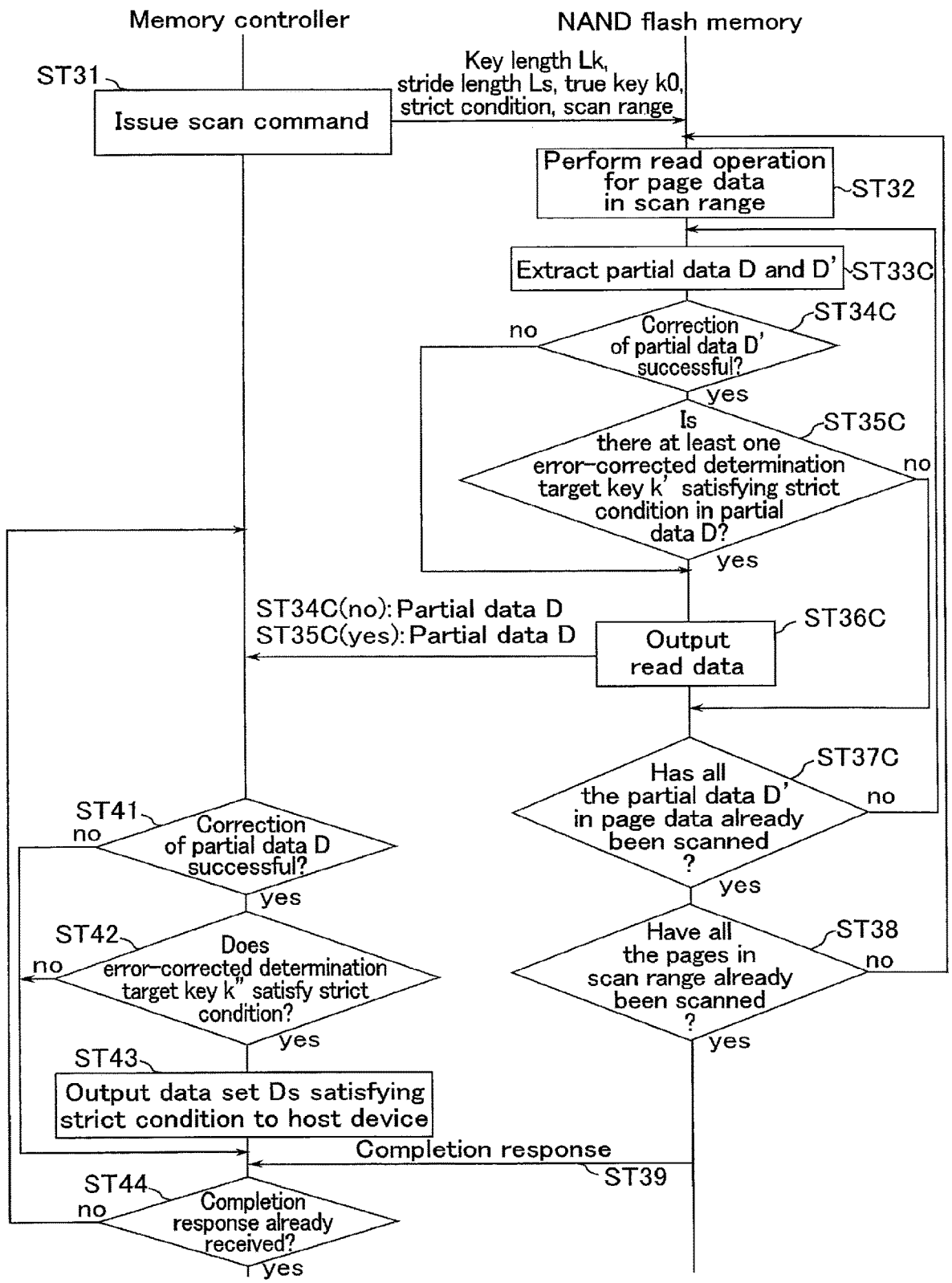
FIG. 10 is a flowchart for explaining scan processing in the memory system according to the second embodiment.

FIG. 10 is a flowchart for explaining scan processing in the memory system according to the second embodiment. FIG. 10 corresponds to FIG. 5 in the first embodiment, and shows an example where steps ST33C through ST37C are performed instead of steps ST33 through ST37 shown in FIG. 5, and step ST40 is omitted.

As shown in FIG. 10, since steps ST31 and ST32 are equivalent to those in the first embodiment, the description thereof is omitted.

In step ST33C, the partial data extraction circuit 191 extracts partial data D from the page data read in step ST32, and extracts partial data D' that includes a determination target key k from the partial data D. For example, the partial data extraction circuit 191 extracts partial data D' based on the key length Lk and the stride length Ls, and sets a key k in the partial data D' as a determination target key k (for example, the key k1 in the partial data D'1 in FIG. 8).

In step ST34C, an error detection and an error correction are performed based on the parity pk in the partial data D' extracted in step ST33C. If the correction of the partial data D' is successful (Yes in step ST34C), the processing in the NAND flash memory 100 proceeds to step ST35; if the correction fails (No in step ST34C), the processing in the NAND flash memory 100 omits step ST35C and proceeds to step ST36.

In step ST35C, the internal comparison circuit 193 determines whether or not there is at least one error-corrected determination target key k' satisfying the strict condition present in the partial data D. If there is at least one determination target key k' satisfying the strict condition in the partial data D (Yes in step ST35C), the processing in the NAND flash memory 100 proceeds to step ST36C; if all the determination target keys k' in the partial data D do not satisfy the strict condition (No in step ST35C), the processing in the NAND flash memory 100 proceeds to step ST37C.

In step ST36C, the NAND flash memory 100 outputs read data, which is a target for output, to the memory controller 200.

Specifically, if the error detection and error correction fail in step ST34C (No in step ST34C), the NAND flash memory 100 sends to the memory controller 200 the partial data D that includes the partial data D' for which the error correction has failed.

If there is at least one determination target key k' which has been determined to satisfy the strict condition in step ST35C (Yes in step ST35C), the NAND flash memory 100 sends to the memory controller 200 the partial data D that includes the corrected determination target key k' satisfying the strict condition.

In step ST37C, the NAND flash memory 100 determines whether or not all pieces of partial data D' in the page data read in step ST32 have been scanned. If there are partial data D' that has not yet been scanned (No in step ST37C), the processing in the NAND flash memory 100 returns to step ST33. Thus, steps ST33C through ST36C are repeated until the scanning of all pieces of the partial data D' in the page data is finished. If all items of the partial data D' have been scanned (Yes in step ST37C), the processing in NAND flash memory 100 proceeds to step ST38.

Since the processing in step ST38 and thereafter is the same as that in the first embodiment except that step ST41 is performed without step ST40 being performed, description of the processing is omitted.

2.3 Advantageous Effects of Second Embodiment

According to the second embodiment, the memory controller 200 assigns a parity p applied to the strong ECC 251 and a parity pk applied to the high throughput ECC circuit 192 to the page data. The data size of the partial data D' that includes a parity pk is smaller than the data size of the partial data D that includes a parity p. It is thereby possible to reduce loads required for the error detection and the error correction by the strong ECC 251. Thus, the speed of the scan processing in the NAND flash memory 100 can be enhanced.

Through performing the patrol processing, if there is a possibility that the page data contains many errors that cannot be corrected by the high throughput ECC circuit 192, correct page data can be written in the memory cell array 110. For this reason, it is possible to increase the possibility that the high throughput ECC circuit 192 will successfully perform the error correction when the scan processing is performed.

2.4 Modifications of Second Embodiment

The second embodiment is not limited to the above-described example, and various modifications can be made thereto. Hereinafter, the same configurations and operations as those of the second embodiment will be omitted, and mainly those differing from those of the second embodiment will be described.

2.4.1 First Modification of Second Embodiment

For example, the example where the parity pk is assigned to all the data of each key k is described in the second embodiment; however, the second embodiment is not limited thereto. For example, the parity pk may be assigned to a part of the data of each key k.

Figure 11:
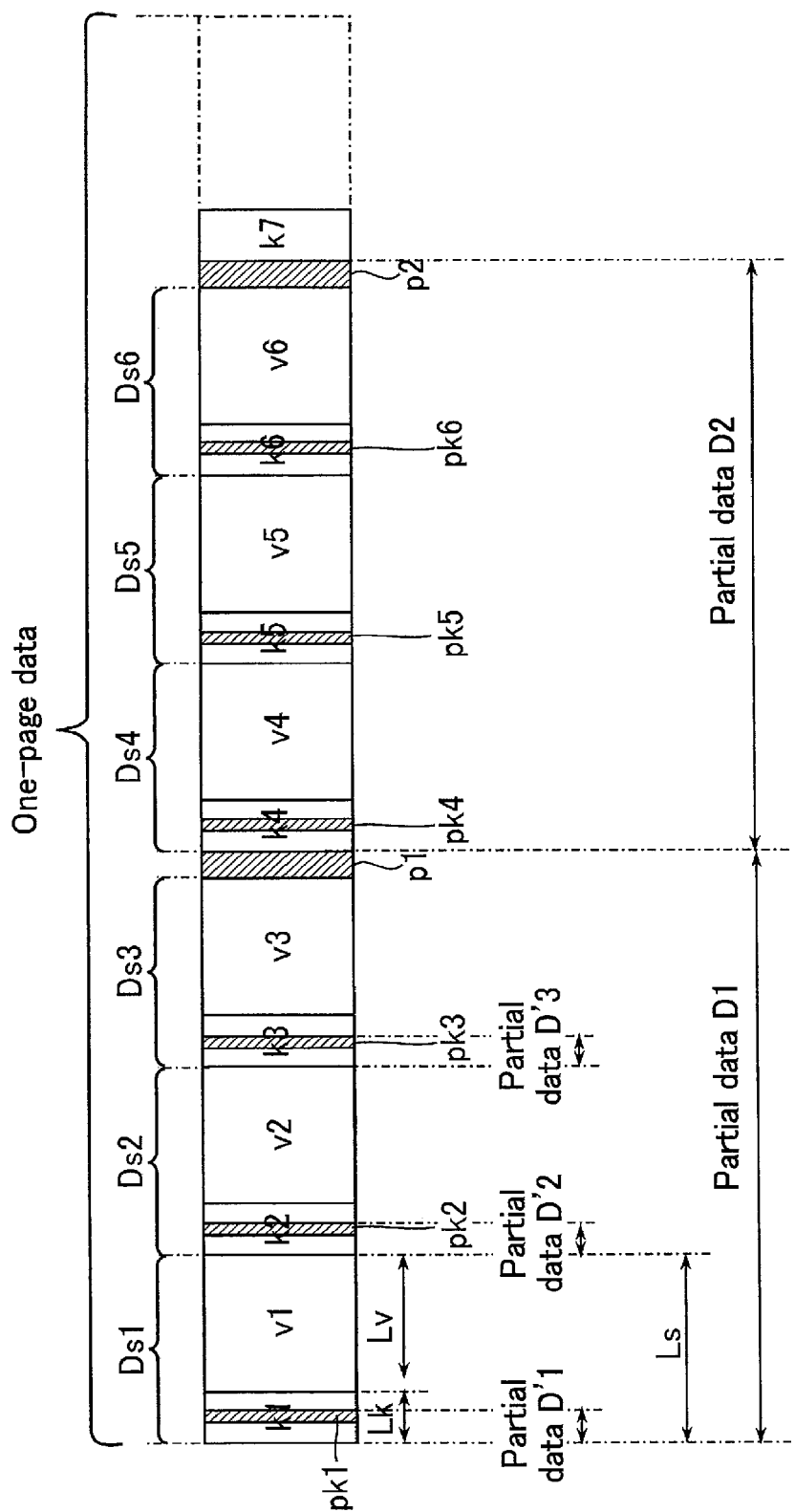
FIG. 11 is a schematic diagram for explaining a configuration of page data according to a first modification of the second embodiment.

FIG. 11 is a schematic diagram for explaining page data stored in the memory cell array according to the first modification of the second embodiment, and corresponds to FIG. 8 in the second embodiment.

As shown in FIG. 11, the partial data D'1 through D'3 include a set of a part of key k1 and parity pk1, a set of a part of key k2 and parity pk2, and a set of a part of key k3 and parity pk3, respectively. In other words, the high throughput ECC circuit 192 skips an error detection and an error correction for the parts where the parities pk are not allocated-to in the values v and the keys k, and performs the error detection and the error correction on the parts where the parities pk are allocated-to in the values v and the keys k.

Figure 12:
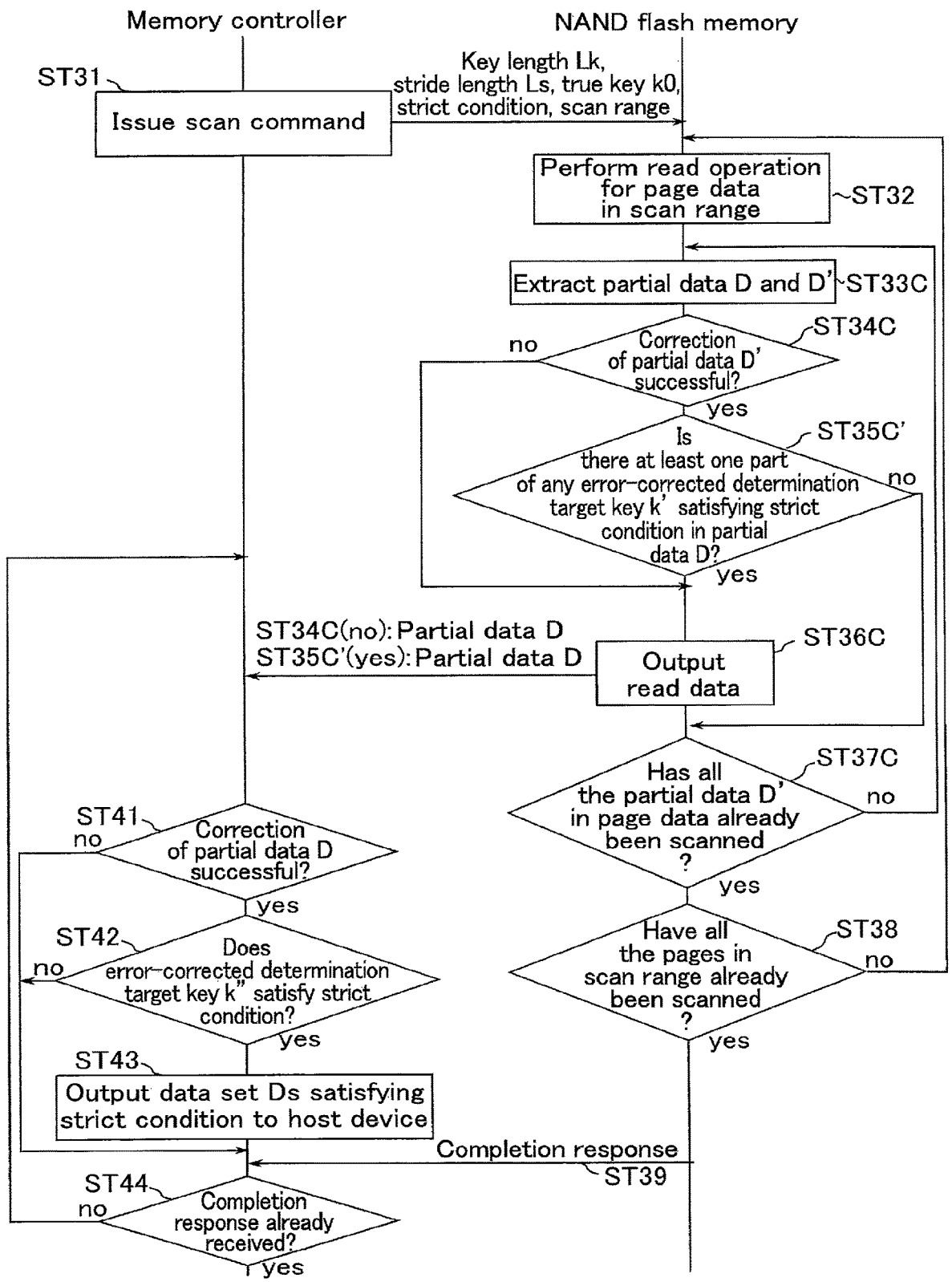
FIG. 12 is a flowchart for explaining scan processing in a memory system according to the first modification of the second embodiment.

FIG. 12 is a flowchart for explaining scan processing in the memory system according to the first modification of the second embodiment. FIG. 12 corresponds to FIG. 10 in the second embodiment, and shows an example where step ST35C' is performed instead of step ST35C shown in FIG. 10.

As shown in FIG. 12, in step ST35C', the internal comparison circuit 193 determines whether or not there is at least one part of any error-corrected determination target key k' satisfying the strict condition (namely, the part for which the error correction has been performed in step ST34C) present in the partial data D. Specifically, the internal comparison circuit 193 determines whether or not a part of the true key k0 perfectly matches a part of the error-corrected determination target key k'. If there is at least one part of the error-corrected determination target key k' satisfying the strict condition in the partial data D (Yes in step ST35C'), the processing in the NAND flash memory 100 proceeds to step ST36C; if all the error-corrected determination target keys k' in the partial data D do not satisfy the strict condition (No in step ST35C'), the processing in the NAND flash memory 100 omits step ST36C and proceeds to step ST37C.

The processing in the internal comparison circuit 193 in the above-described step ST35C' can be regarded as, in other words, processing of determining whether or not all the entirety of the true key k0 partially matches all the entirety of the error-corrected determination target key k'. Through the above-described operation, the range targeted for the error correction can be narrowed, and it is thereby possible to further improve the throughput of the high-throughput ECC circuit 192, and to enhance the speed of the scan processing.

2.4.2 Second Modification of Second Embodiment

In the above-described second embodiment, the memory controller 200 compares, in the patrol processing, the determination target key k output without undergoing the error correction by the high throughput ECC circuit 192 with the determination target key k" for which the error correction is performed by the strong ECC circuit 251; however, the second embodiment is not limited to this example. For example, in the patrol processing, the memory controller 200 may compare the determination target key k for which the error correction has been attempted by the high throughput ECC circuit 192 with the determination target key k" for which the error correction is performed by the strong ECC circuit 251.

Figure 13:
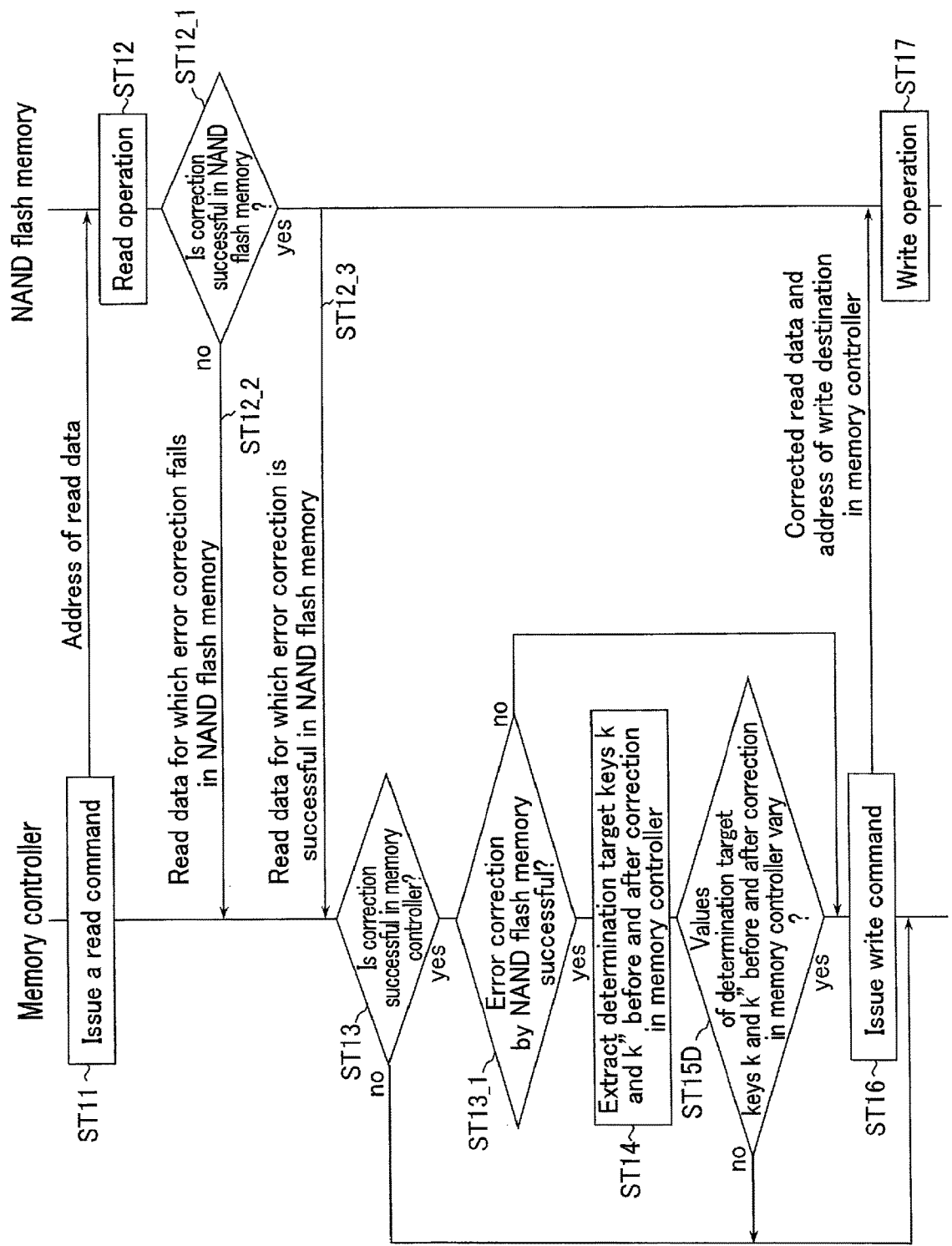
FIG. 13 is a flowchart for explaining patrol processing in a memory system according to a second modification of the second embodiment.

FIG. 13 is a flowchart for explaining patrol processing in a memory system according to a second modification of the second embodiment. FIG. 13 corresponds to FIG. 9 in the second embodiment, and shows an example where steps ST12_1, ST12_2, ST12_3, and ST13_1 are further performed, and step ST15D is performed instead of step ST15 shown in FIG. 9.

As shown in FIG. 13, in step ST12, the NAND flash memory 100 performs a read process upon receipt of the read command. The NAND flash memory 100 reads, from the memory cell array 110, read data corresponding to the address information in the read command.

In step ST12_1, the high throughput ECC circuit 192 in the NAND flash memory 100 performs an error detection and an error correction on the read data. If the error correction fails (No in step ST12_1), the processing in the NAND flash memory 100 proceeds to step ST12_2; if the correction is successful (Yes in step ST12_1), the processing in the NAND flash memory 100 proceeds to step ST12_3.

In step ST12_2, the NAND flash memory 100 outputs read data for which the error correction has failed in step ST12_1 to the memory controller 200.

In step ST12_3, the NAND flash memory 100 outputs read data for which the error correction was successful in step ST12_1 to the memory controller 200.

In step ST13, the strong ECC circuit 251 in the memory controller 200 performs an error detection and an error correction on the read data. If the error correction is successful (Yes in step ST13), the processing proceeds to step ST13_1; if the correction fails (No in step ST13), the memory controller 200 determines it to be an ECC failure and notifies the host apparatus 300 of the information, and finishes the patrol processing.

In step ST13_1, the memory controller 200 determines whether or not the error correction by the high throughput ECC circuit 192 of the NAND flash memory 100 was successful for the read data received from the NAND flash memory 100. If the error correction by the NAND flash memory 100 was successful (Yes in step ST13_1), the processing in the memory controller 200 proceeds to step ST14, and if the error correction failed (No in step ST13_1), the processing in the memory controller 200 proceeds to step ST16.

Since step ST14 of the processing in the memory controller 200 is equivalent to that in the second embodiment, description thereof is omitted.

In step ST15D, the memory controller 200 determines whether or not the determination target key k before the correction by the strong ECC circuit 291 differs from the determination target key k" after the correction. If they match (Yes in step ST15D), the patrol processing is finished; if they do not match (No in step ST15D), the processing proceeds to step ST16.

Since steps ST16 and ST17 are equivalent to those of the second embodiment, description thereof is omitted.

Through the above-described operation, if the number of error bits is increased to the extent that the high throughput ECC circuit 192 is not able to correct them all, correct page data can be written in the memory cell array 110. For this reason, it is possible to increase the possibility that the high throughput ECC circuit 192 will successfully perform the error correction when the scan processing is performed.

3. Third Embodiment

Next, the memory system according to the third embodiment will be described. In the first and second embodiments, the example where sets of the keys k and the values v corresponding thereto are stored in the same page data is described. The third embodiment differs from the first and second embodiments in that the keys k and the values v corresponding thereto are stored in different sets of page data. Hereinafter, the same configurations and operations as those of the first embodiment will be omitted, and mainly those differing from those of the first embodiment will be described.

3.1 Page Data

Figure 14:
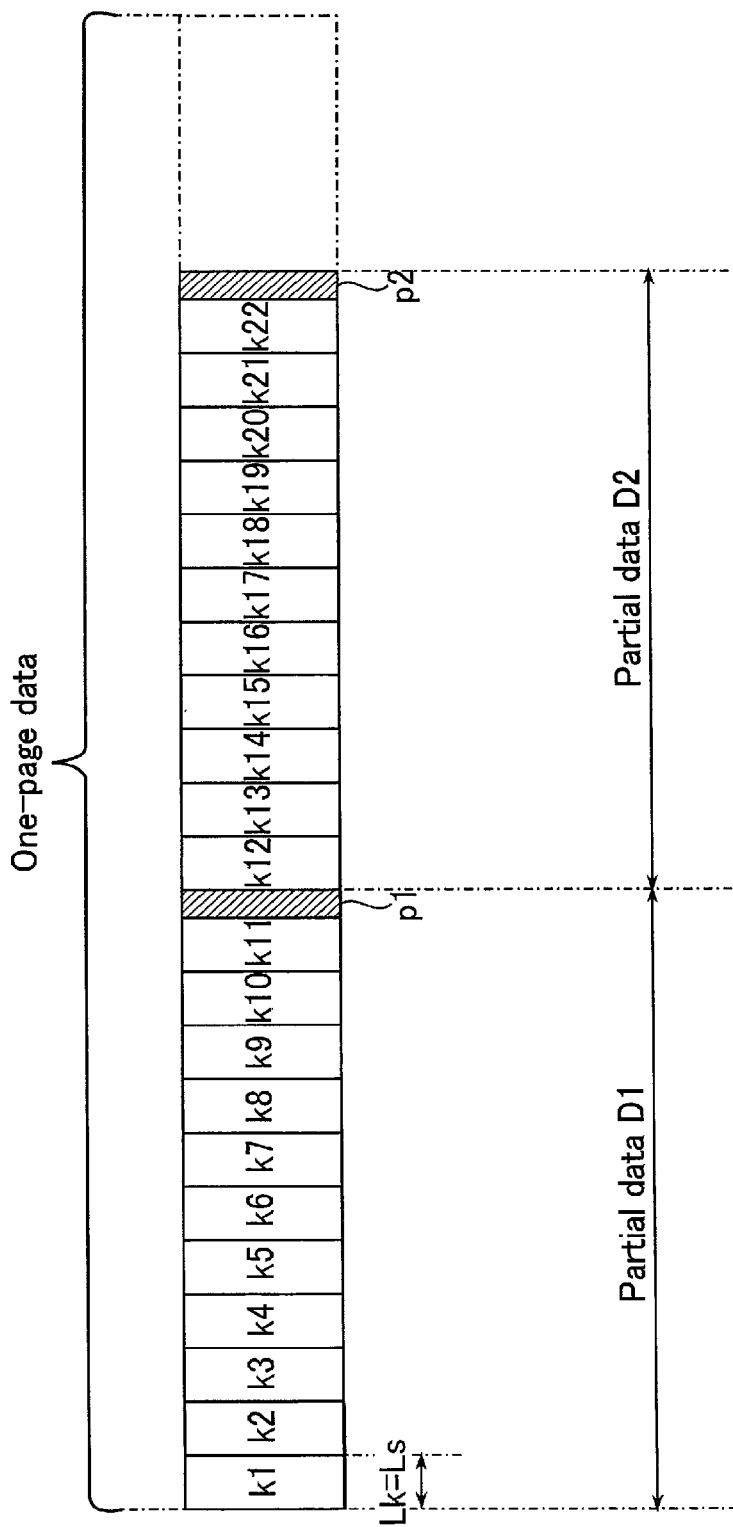
FIG. 14 is a schematic diagram for explaining a configuration of page data according to a third embodiment.

FIG. 14 is a schematic diagram for explaining page data stored in the memory cell array according to the third embodiment, and corresponds to FIG. 4 in the first embodiment.

As shown in FIG. 14, data for one page includes multiple sets of partial data D (D1, D2, . . . ). In the example shown in FIG. 14, the partial data D1 includes eleven keys k1 through k11 and a parity p1, for example. The partial data D2 includes eleven keys k12 through k22 and a parity p2, for example.

The values v corresponding to the keys k are stored in different page data not shown in FIG. 14. In other words, in the third embodiment, the keys k and the values v in a single data set Ds are separately stored in two different sets of page data. In this case, the stride length Ls corresponds to the key length Lk.

The correspondence between the keys k and the values v are managed in the memory controller 200 in advance.

3.2 Scan Processing

Figure 15:
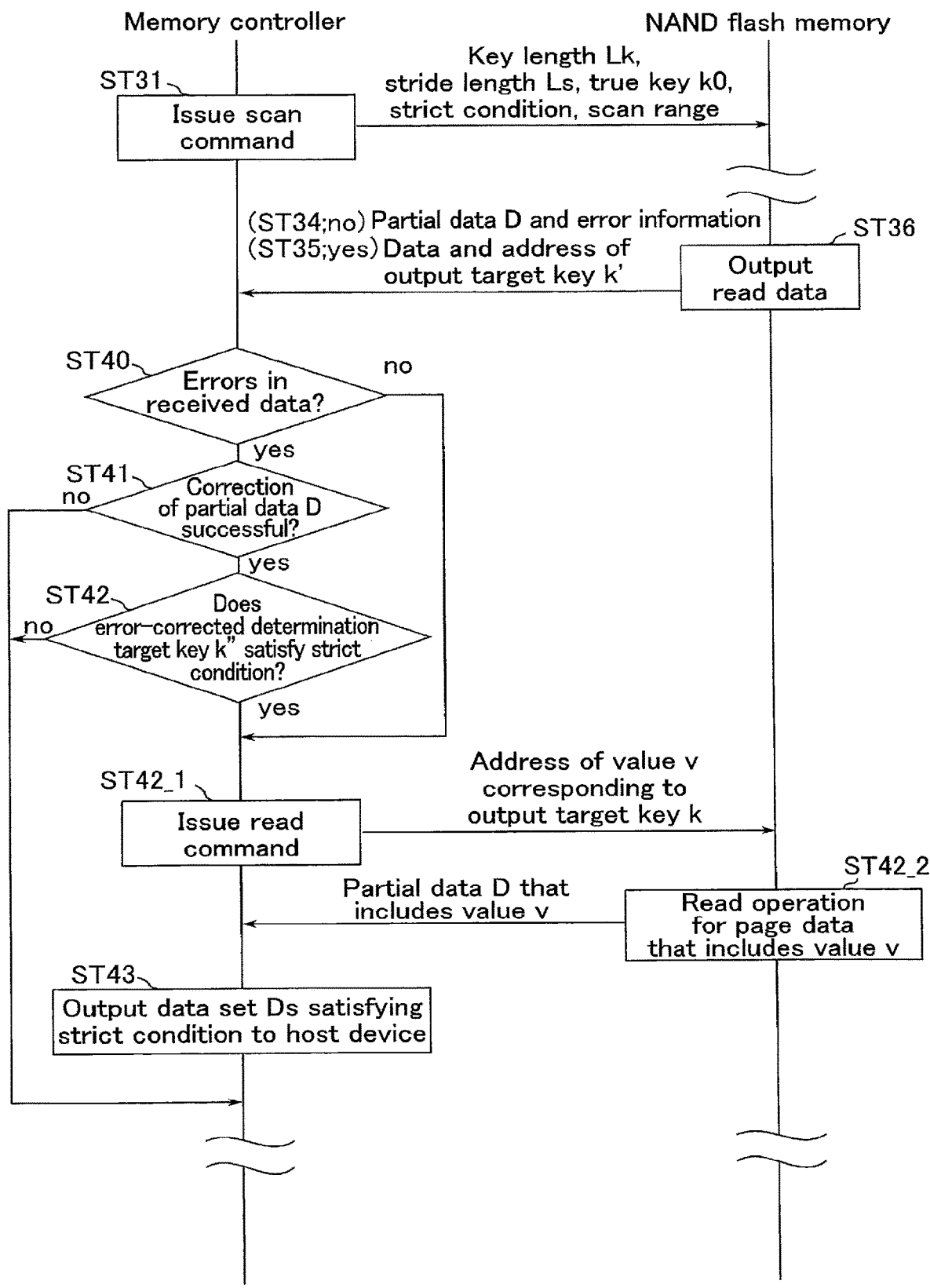
FIG. 15 is a flowchart for explaining scan processing in a memory system according to the third embodiment.

Next, the scan processing in the memory system according to the third embodiment will be described with reference to the flowchart of FIG. 15. FIG. 15 corresponds to FIG. 5 in the first embodiment, and steps ST42_1 and ST42_2 are performed. In FIG. 15, for the sake of explanation, a part of the processing in the NAND flash memory 100 after the issuance of a scan command (steps ST32 through ST35 and ST37 through ST39) and a part of the processing in the memory controller 200 (step ST44) are omitted.

As shown in FIG. 15, the scan command shown in step ST31 includes the stride length Ls having the same length as the key length Lk, as aforementioned. It is thereby possible for the NAND flash memory 100 to recognize that a plurality of keys k are intensively stored in the page data included in the scan range.

Since the processing in steps ST32 through ST35 is the same as that in the first embodiment, description is omitted.

In step ST36, the NAND flash memory 100 selectively sends to the memory controller 200, of the page data read in step ST32, the partial data D for which the error detection and error correction have failed in step ST34 and the error information, or the error-corrected determination target key k' determined to satisfy the strict condition in step ST35 (the output target key k'). The NAND flash memory 100 also sends the address information of the output target key k' to the memory controller 200, when the output target key k' is sent. If the output target keys k' are unnecessary for the processing thereafter (in other words, if it is sufficient to only obtain the values v suffice for the processing thereafter), the output target keys k' need not be sent, and only the address information may be sent.

In step ST40, the memory controller 200 determines whether or not the data output from the NAND flash memory 100 in step ST36 contains errors. If it is determined that there are errors (in other words, if the partial data D for which the error detection and error correction fails is output in step ST35), the processing in the memory controller 200 proceeds to step ST41. If it is determined that there are no errors (in other words, if the data and address of the output target key k' satisfying the strict condition are output in step ST45), the processing in the memory controller 200 proceeds to step ST42_1.

In step ST41, the strong ECC circuit 251 performs error detection and error correction. If the correction of the partial data D is successful (Yes in step ST41), the processing in the memory controller 200 proceeds to step ST42; if the correction fails (No in step ST41), the memory controller 200 determines it to be an ECC failure, and omits steps ST42, ST42_1, and ST43. In the case of an ECC failure, the host apparatus 300 may be notified of the ECC failure, for example.

In step ST42, the external comparison circuit 252 in the memory controller 200 determines whether or not the error-corrected determination target key k" satisfies the strict condition with respect to the true key k0. If the strict condition is satisfied (Yes in step ST42), the processing in the memory controller 200 proceeds to step ST42_1; if the strict condition is not satisfied (No in step ST42), the processing in the memory controller 200 omits steps ST42_1 and ST43.

It is thus possible for the memory controller 200 to specify a value v corresponding to the output target key k' from the data output from the NAND flash memory 100.

In step ST42_1, the memory controller 200 issues a read command, and sends it to the NAND flash memory 100. The read command includes address information of the value v corresponding to the output target key k'.

In step ST42_2, upon receipt of the read command, the NAND flash memory 100 reads page data corresponding to the address information in the read command and outputs it to the latch circuit in the sense amplifier 180. Then, the NAND flash memory 100 selectively outputs to the memory controller 200 the partial data D that includes the value v designated in the read command.

In step ST43, the data set Ds satisfying the strict condition (in other words, the output target key and the value v corresponding thereto) is output to the host apparatus 300.

In the example shown in FIG. 15, the case where the reading of the values v in steps ST42_1 and ST42_2 is performed as a part of the scan processing is described; however, the example is not limited thereto. For example, steps ST42_1 and ST42_2 may be performed after the scan processing.

3.3 Advantageous Effects of Third Embodiment

According to the third embodiment, the memory controller 200 issues a scan command that includes a stride length Ls having the same length as the key length Lk. It is thereby possible for the NAND flash memory 100 to recognize that the keys k and the values v are stored in different sets of page data.

Furthermore, the NAND flash memory 100 performs the error detection and the error correction on the partial data D including the keys k, and the internal comparison based on the strict condition. The NAND flash memory 100 outputs to the memory controller 200 the partial data D for which the error correction fails and the error information, or the error-corrected key k' satisfying the strict condition and the address information thereof. It is thereby possible for the memory controller 200 to specify a value v corresponding to the output target key k, and to issue a read command to read the value v.

The NAND flash memory 100 outputs the partial data D of the page data that includes the value v when outputting the value v. It is thus possible to reduce an amount of communication between the NAND flash memory 100 and the memory controller 200.

3.4 Modifications of Third Embodiment

The third embodiment is not limited to the above-described example, and various modifications can be made thereto. Hereinafter, the same configurations and operations as those of the third embodiment will be omitted, and mainly those differing from those of the third embodiment will be described.

3.4.1 First Modification of Third Embodiment

For example, the memory system 1 may use multiple types of write modes. Specifically, the memory system 1 can use different write modes, such as a single-level cell (SLC) mode, a multi-level cell (MLC) mode, and a triple-level cell (TLC) mode, in combination. The SLC mode, MLC mode, and TLC mode are a write mode for storing 1-bit data, 2-bit data, and 3-bit data, respectively, for a single memory cell transistor MT.

FIG. 16 is an example of the threshold voltages of the memory cell transistors MT in the memory system according to the first modification of the third embodiment, and shows three types of the threshold voltage distribution and of the read voltage group in the respective cases where the SLC mode, the MLC mode, and the TLC mode are used. As shown in FIG. 16, the plurality of memory cell transistors MT form a plurality of threshold voltage distributions in accordance with an applied write mode, in other words, the number of bits of stored data.

As shown in FIG. 16, if the SLC mode (1 bit/cell) is used, the threshold voltages of the plurality of memory cell transistors MT form two threshold voltage distributions. These two distributions are called an "ER" state and an "A" state, from lower to higher threshold voltages. In the SLC mode, different 1-bit data is allocated to the threshold voltage distributions in the "ER" state and the "A" state, respectively.

If the MLC mode (2 bit/cell) is used, the threshold voltages of the plurality of memory cell transistors MT form four threshold voltage distributions. These four distributions are called an "ER" state, an "A" state, a "B" state, and a "C" state, from lower to higher threshold voltages. In the MLC mode, different 2-bit data is allocated to the threshold voltage distributions in the "ER" state through the "C" state, respectively.

If the TLC mode (3 bit/cell) is used, the threshold voltages of the plurality of memory cell transistors MT form eight threshold voltage distributions. These eight distributions are called an "ER" state, an "A" state, a "B" state, a "C" state, a "D" state, an "E" state, an "F" state, and a "G" state, from lower to higher threshold voltages. In the TLC mode, different 3-bit data is allocated to the threshold voltage distributions in the "ER" state through the "G" state, respectively.

In each write mode, a read voltage is set between neighboring threshold distributions. Specifically, a read voltage VA is set between a maximum threshold voltage in the "ER" state and a minimum threshold voltage in the "A" state. Similarly, the read voltage VB is set between the "A" state and the "B" state; the read voltage VC is set between the "B" state and the "C" state; the read voltage VD is set between the "C" state and the "D" state; the read voltage VE is set between the "D" state and the "E" state; the read voltage VF is set between the "E" state and the "F" state; the read voltage VG is set between the "F" state and the "G" state.

In each write mode, a read pass voltage VREAD is set to a voltage higher than a maximum threshold voltage in the highest threshold voltage distribution. A memory cell transistor MT to which the read pass voltage VREAD is applied is turned on, regardless of data stored therein. Each of the read voltages and each of the pass voltages may be set at the same voltage value in each write mode, or may be set at different voltage values.

In FIG. 16, although the case where 1-bit data through 3-bit data are stored in the memory cell transistors MT is illustrated, the embodiment is not limited thereto. For example, four- or more bit data may be stored in one memory cell transistor MT, and a write mode corresponding to this case may be set.

If a mode with which multiple bit data can be written, such as the MLC mode and the TLC mode, is used for the memory cell transistors MT, it is possible to store more data than the case where the SLC mode is used. However, since the read pass voltage VREAD and the threshold voltages that can be set for the memory cell transistors MT have an upper limit, the margin of a threshold voltage between two states in the MLC mode and the TLC mode is smaller than that in the SLC mode. For this reason, from the viewpoint of data storage reliability, the SLC mode may be more advantageous than the MLC mode and the TLC mode.

FIG. 17 is a schematic diagram for explaining page data stored in the memory cell array according to the first modification of the third embodiment. FIG. 17 shows an example where the keys k and the values v are separately stored in a data area for one page in a cell unit CU to which the SLC mode is applied, and in a three-page data area (upper page, middle page, and lower page) in a cell unit CU to which the TLC mode is applied.

As shown in FIG. 17, in the present modification, the keys k1 through k22 are selectively stored in the data area for one page in a cell unit CU to which the SLC mode is applied. The values v_u1 through v_u6, v_m1 through v_m6, and v_l1 through v_l6 are selectively stored in the three-page data area in a cell unit CU to which the TLC mode is applied. It is thereby possible to enhance the reliability of the keys k which are a target for the scan processing through the use of the SLC mode, and to enhance the effectiveness of the scan processing.

The values v that tend to be larger than the keys k in their data size are stored with the use of the TLC mode, which has a high data density; thus, it is possible to suppress the increase in loads on the data capacity.

3.4.2 Second Modification of Third Embodiment

In the foregoing first modification of the third embodiment, the case where the keys k and the values v are stored in two cell units CU using different write modes is described; however, the embodiment is not limited thereto.

Figure 18:
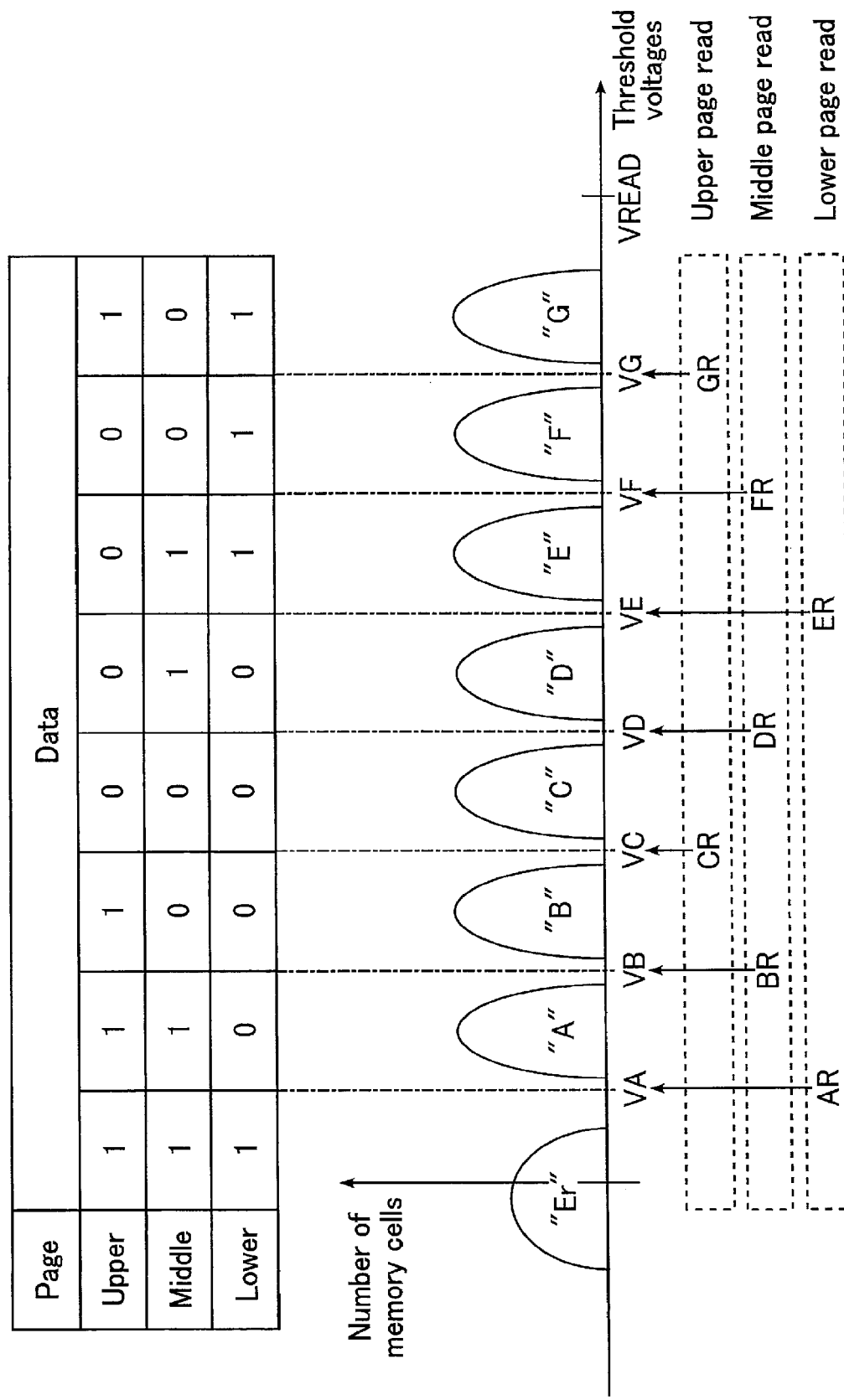
FIG. 18 is a schematic diagram for explaining threshold voltage distributions of memory cell transistors according to a second modification of the third embodiment.

FIG. 18 is a diagram showing the relationship between three-page data written in a cell unit CU when the TLC mode is used and the threshold voltages of the memory cell transistors MT.

As shown in FIG. 18, the threshold voltage distributions are obtained by writing 3-bit (3-page) data consisting of the above-mentioned lower bit, middle bit, and upper bit. The relationship between the above "Er" state through "G" state and the lower bit, the middle bit, and upper bit is as follows:

"Er" state: "µl" (written in the order of "upper/middle/lower")
"A" state: "110"
"B" state: "100"
"C" state: "000"
"D" state: "010"
"E" state: "011"
"F" state: "001"
"G" state: "101"

Thus, only one of three bits changes between data corresponding to two adjacent states in the threshold voltage distributions.

Accordingly, when the lower bit is read, a voltage corresponding to the boundary where the value ("0" or "1") of the lower bit changes may be used; this also applies when reading the middle bit and the upper bit.

In other words, in coding such as the one shown in the example of FIG. 18, in lower page reading, the voltage VA, which distinguishes between the "Er" state and the "A" state, and the voltage VE, which distinguishes between the "D" state and the "E" state, are used as read voltages. The read operations using the voltages VA and VE will be referred to as read operations AR and ER, respectively.

The read operation AR determines whether or not the threshold voltage of a memory cell transistor MT is lower than the voltage VA. In other words, a memory cell transistor MT in an erasure state is specified by the read operation AR. The read operation ER determines whether or not the threshold voltage of a memory cell transistor MT is lower than the voltage VE.

In middle page reading, the voltage VB, which distinguishes between the "A" state and the "B" state, the voltage VD, which distinguishes between the "C" state and the "D" state, and the voltage VF, which distinguishes between the "E" state and the "F" state, are used as read voltages. The read operations using the voltages VB, VD, and VF will be referred to as read operations BR, DR, and FR, respectively.

The read operation BR determines whether or not the threshold voltage of a memory cell transistor MT is lower than the voltage VB. The read operation DR determines whether or not the threshold voltage of a memory cell transistor MT is lower than the voltage VD. The read operation FR determines whether or not the threshold voltage of a memory cell transistor MT is lower than the voltage VF.

In upper page reading, the voltage VC, which distinguishes between the "B" state and the "C" state, and the voltage VG, which distinguishes between the "F" state and the "G" state, are used as read voltages. The read operations using the voltages VC and VG will be referred to as read operations CR and GR, respectively.

The read operation CR determines whether or not the threshold voltage of a memory cell transistor MT is lower than the voltage VC. The read operation GR determines whether or not the threshold voltage of a memory cell transistor MT is lower than the voltage VG.

Thus, in the TLC Mode, the upper page, the middle page, and the lower page differ from each other in the amplitudes of applied read voltages and the number thereof. For this reason, the reliability of stored data may vary between pages.

Specifically, of the eight states in the TLC mode for example, the threshold voltages of the memory cell transistors MT belonging to the "Er" state are more prone to increase than the other states. For this reason, the threshold voltage distribution of the "Er" state and that of the "A" state relatively tend to overlap. For this reason, the reliability of the lower page data for which data is confirmed using the voltage VA may be lower than that of the other page data.

For example, the threshold voltages of the memory cell transistors MT belonging to the "G" state tend to become lower than those belonging to the other states. For this reason, the threshold voltage distribution of the "F" state and that of the "G" state relatively tend to overlap. For this reason, the reliability of the upper page data for which data is confirmed using the voltage VG may be lower than that of the other page data.

Thus, in the three-bit data stored using the TLC mode, the middle page data may have a relatively higher reliability than that of the upper page data and the lower page data.

Figure 19:
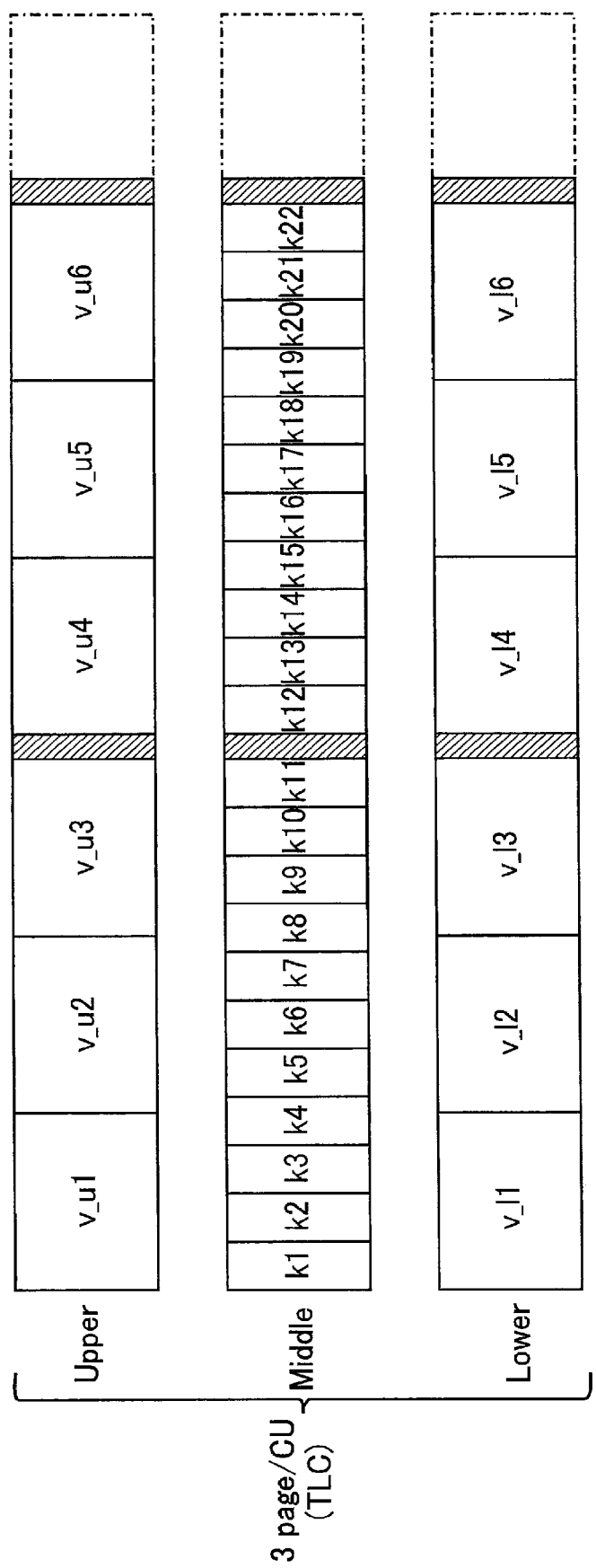
FIG. 19 is a schematic diagram for explaining a configuration of page data according to the second modification of the third embodiment.

FIG. 19 is a schematic diagram for explaining page data stored in the memory cell array according to the second modification of the third embodiment. FIG. 19 shows the case where the keys k and the values v are stored separately in the three-page data area (upper page, middle page, and lower page) in a cell unit CU to which the TLC mode is applied.

As shown in FIG. 19, in the present modification, the keys k1 through k22 are selectively stored in the middle page. In the lower page and the upper page, the values v_u1 through v_u6 and v_l1 through v_l6 are selectively stored. It is thereby possible to enhance the reliability of the keys k which are a target for the scan processing, and to enhance the effectiveness of the scan processing, compared to the case where the keys k are stored in the lower page or the upper page.

Furthermore, it is possible to suppress an increase in loads on the data capacity through the storage of keys k and the values v in the TLC mode, which has a high data density.

4. Fourth Embodiment

In the foregoing first through third embodiments, examples are described where the key length Lk and the stride length Ls are a fixed length; however, the embodiments are not limited thereto. For example, the key length Lk and the stride length Ls may have a variable length. Hereinafter, the same configurations and operations as those of the first embodiment will be omitted, and mainly those differing from those of the first embodiment will be described.

4.1 Page Data

FIG. 20 is a schematic diagram for explaining a part of page data stored in the memory cell array according to the fourth embodiment, and corresponds to FIG. 4 in the first embodiment.

As shown in FIG. 20, the partial data D1 includes: a set of a key k1, data length information s1, and a value v1; a set of a key k2, data length information s2, and a value v2; and a parity p1. In the example shown in FIG. 20, the key length Lk1 of the key k1 and the key length Lk2 of the key k2 differ from each other, and the stride length Ls1 and the stride length Ls2 differ from each other.

The data length information s1 stores information indicating the key length Lk1 and the stride length Ls1, for example. In the data length information s2, information indicating the key length Lk2 and the stride length Ls2 is stored, for example.

With the above-described configuration, if there are no errors in the partial data D, the NAND flash memory 100 can specify the locations of the keys k1 and k2 by referring to the data length information s1 and s2.

4.2 Scan Processing

FIG. 21 is a flowchart for explaining the scan processing in the memory system according to the fourth embodiment. FIG. 21 corresponds to FIG. 5 in the first embodiment, and shows an example where step ST34_1 is added and step ST31E is performed instead of step ST31.

As shown in FIG. 21, in step ST31E, the memory controller 200 issues a scan command that includes the true key k0, the strict condition, and the scan range, and sends it to the NAND flash memory 100. In other words, in the fourth embodiment, the key length Lk and the stride length Ls have variable lengths, and the information is not included in the scan command.

In step ST32, the NAND flash memory 100 performs reading of page data within the scan range. The sense amplifier 180 reads the page data from the memory cell array 110, and stores the page data in the latch circuit of the sense amplifier 180.

In step ST33, the partial data extraction circuit 191 extracts partial data D including a determination target key k from the page data read in step ST32. At this time, the locations of the key k and the value v in the partial data D are not specified.

In step ST34, the high throughput ECC circuit 192 performs an error detection and an error correction based on the parity p in the partial data D extracted in step ST33. If the correction of the partial data D is successful (Yes in step ST34), the processing in the NAND flash memory 100 proceeds to step ST34_1; if the correction fails (No in step ST34), the processing in the NAND flash memory 100 omits steps ST34_1 and ST35 and proceeds to step ST36.

In step ST34_1, the partial data extraction circuit 191 extracts data length information s from the error-corrected partial data D. Furthermore, the partial data extraction circuit 191 specifies a determination target key k in the partial data D based on the key length Lk and the stride length Ls in the data length information s.

Since the processing in step ST35 and thereafter is the same as that in the first embodiment, description is omitted.

The scan processing is thus finished.

4.3 Advantageous Effects of Fourth Embodiment

According to the fourth embodiment, the page data includes the data length information s in addition to the keys k and the values v. Upon receipt of a scan command that does not include the key length Lk and the stride length Ls, the high throughput ECC circuit 192 performs error correction. It is thus possible, if the error correction is successful, for the NAND flash memory 100 to specify a location of a key k of variable-length data based on the data length information s. It is thus possible for the internal comparison circuit 193 to exclude a determination target key k that does not match the true key k0 from the output target to the memory controller 200. For this reason, it is possible to suppress an increase in an amount of data communicated between the NAND flash memory 100 and the memory controller 200 even in the case where the keys k and the values v have variable lengths.

5. Others

In the foregoing first through third embodiments, examples where the internal comparison circuit 193 performs internal comparison based on the strict condition are described; however, the embodiments are not limited thereto. For example, the internal comparison circuit 193 may perform the internal comparison based on a relaxed condition.

In other words, the internal comparison circuit 193 may set a condition ("relaxed condition") that encompasses the strict condition and but is more relaxed than the strict condition. Examples of the relaxed condition include: a partially matching comparison condition that determines whether or not read data is within a predetermined Hamming distance with respect to true data; a value comparison condition that determines whether or not read data is larger (or smaller) than true data; and a combination thereof.

FIG. 22 is a flowchart for explaining scan processing in a memory system according to a modification. FIG. 22 corresponds to FIG. 5 in the first embodiment, and shows an example where steps ST34 through ST40 shown in FIG. 5 are omitted and steps ST31F, ST35F, and ST36F are performed instead of steps ST31, ST35, and ST36.

As shown in FIG. 22, in step ST31F, the memory controller 200 issues a scan command that includes the key length Lk, the stride length Ls, the true key k0, the relaxed condition, and the scan range, and sends it to the NAND flash memory 100. The relaxed condition includes information indicating an allowable Hamming distance between the determination target key k and the true key k0.

Since the processing in steps ST32 and ST33 is the same as that in the first embodiment, description is omitted.

When step ST33 is finished, the processing in the NAND flash memory 100 proceeds to step ST35F. In other words, the NAND flash memory 100 skips the processing in the high throughput ECC circuit 192 in the scan processing.

In step ST35F, the internal comparison circuit 193 determines whether or not the determination target key k satisfies the relaxed condition with respect to the true key k0. Specifically, the internal comparison circuit 193 determines whether or not the Hamming distance between the true key k0 and the determination target key k satisfies the relaxed condition included in the scan command. If the relaxed condition is satisfied (Yes in step ST35F), the processing in the NAND flash memory 100 proceeds to step ST36F; if the relaxed condition is not satisfied (No in step ST35F), the processing in the NAND flash memory 100 omits step ST36F and proceeds to step ST37.

In step ST36F, the NAND flash memory 100 outputs the partial data D that includes at least one determination target key k determined to satisfy the relaxed condition in step ST35F to the memory controller 200. At this time, error information is not output as the error detection and error correction by the high throughput ECC circuit 192 are not performed in the NAND flash memory 100.

Since the processing in step ST37 and thereafter is the same as that in the first embodiment except that step ST40 is omitted, description of the processing is omitted.

Through the above-described operation, the NAND flash memory 100 can perform the internal comparison allowing a partial error, without performing the error detection and the error correction. It is thus possible to select data to be output to the memory controller 200 without performing an error detection and an error correction.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A nonvolatile memory comprising:
a plurality of first memory cell transistors coupled to a first word line; and
a control circuit, wherein
in a first operation, the control circuit is configured to:
read, from the plurality of first memory cell transistors, a first data sequence that includes at least one first partial data sequence;
determine whether or not the first partial data sequence includes an error;
output, if it is determined that the first partial data sequence includes an error, the first data sequence to a memory controller;
further determine, if it is determined that the first partial data sequence does not include an error, whether or not the first partial data sequence satisfies a condition;
selectively output, if it is determined that the first partial data sequence satisfies the condition, the first partial data sequence to the memory controller; and
not output, if it is determined that the first partial data sequence does not satisfy the condition, the first partial data sequence to the memory controller.

2. The nonvolatile memory of claim 1, wherein
in the first operation, the control circuit is configured to:
perform first correction processing to correct an error in the first partial data sequence;
determine that the first partial data sequence for which the first correction processing is successful does not include an error; and
determine that the first partial data sequence for which the first correction processing fails includes an error.

3. The nonvolatile memory of claim 1, wherein
in the first operation, the control circuit is configured to:
determine, if it is determined that the first partial data sequence does not include an error, whether or not the first partial data sequence satisfies the condition with respect to a second partial data sequence.

4. The nonvolatile memory of claim 1, wherein
the first data sequence includes two or more first partial data sequences, and
in the first operation, the control circuit is configured to:
output, if it is determined that at least one of the two or more first partial data sequences satisfies the condition, the first data sequence to the memory controller; and
not output, if it is determined that all of the two or more first partial data sequences do not satisfy the condition, any data sequence to the memory controller.

5. The nonvolatile memory of claim 4, wherein
at least two of the two or more first partial data sequences have mutually different data lengths.

6. The nonvolatile memory of claim 1, wherein
the first data sequence includes two or more first partial data sequences, and
in the first operation, the control circuit is configured to:
if it is determined that one of the two or more first partial data sequences satisfies the condition, selectively output to the memory controller the first partial data sequence determined to satisfy the condition; and
if it is determined that one of the two or more first partial data sequences does not satisfy the condition, not output the first partial data sequence to the memory controller.

7. The nonvolatile memory of claim 6, wherein
at least two of the two or more first partial data sequences have mutually different data lengths.

8. The nonvolatile memory of claim 2, wherein
the control circuit is configured to apply hard-decision decoding to the first correction processing.

9. The nonvolatile memory of claim 3, wherein
the control circuit is configured to perform the first operation upon receipt of a first command that includes the condition and the second partial data sequence from the memory controller.

10. The nonvolatile memory of claim 3, wherein
the condition is that the first partial data sequence matches the second partial data sequence.

11. The nonvolatile memory of claim 1, wherein
a communication with the memory controller is compliant with an SDR (single data rate) interface, a toggle DDR (double data rate) interface, or an ONFI (open NAND flash interface).

12. A memory system comprising:
a nonvolatile memory comprising a plurality of first memory cell transistors coupled to a first word line, and a control circuit; and
a memory controller configured to be capable of issuing a first command to the nonvolatile memory, wherein
upon receipt of the first command the control circuit is configured to:
  read a first data sequence that includes at least one first partial data sequence from the plurality of first memory cell transistors;
  determine whether or not the first partial data sequence includes an error;
  output, if it is determined that the first partial data sequence includes an error, the first data sequence to a memory controller;
  determine, if it is determined that the first partial data sequence does not include an error, whether or not the first partial data satisfies a condition;
  selectively output, if it is determined that the first partial data sequence satisfies the condition, the first partial data sequence to the memory controller; and
  not output, if it is determined that the first partial data sequence does not satisfy the condition, any data sequence to the memory controller,
wherein the memory controller is configured to output the first partial data sequence output from the nonvolatile memory to the host apparatus.

13. The memory system of claim 12, wherein
the control circuit is configured to:
  further perform first correction processing to correct an error in the first partial data sequence;
  determine that the first partial data sequence for which the first correction processing is successful does not include an error; and
  determine that the first partial data sequence for which the first correction processing fails includes an error.

14. The memory system of claim 12, wherein
the control circuit is configured to determine, if it is determined that the first partial data sequence does not include an error, whether or not the first partial data satisfies the condition with respect to a second partial data sequence, and
the first command includes the condition and the second partial data sequence.

15. The memory system of claim 14, wherein
the condition is that the first partial data sequence matches the second partial data sequence.

16. The memory system of claim 12, wherein
the memory controller is configured to perform second correction processing to correct an error in a first data sequence output from the nonvolatile memory in accordance with the first command.

17. The memory system of claim 13, wherein
the memory controller is configured to perform second correction processing to correct an error in a first data sequence output from the nonvolatile memory in accordance with the first command, and
the second correction processing by the memory controller has a higher error correction ability than the first correction processing performed by the nonvolatile memory.

18. The memory system of claim 16, wherein
the memory controller is configured to apply soft-decision decoding to the second correction processing.

19. The memory system of claim 12, wherein
the memory controller is configured to perform second correction processing to correct an error in a first data sequence output from the nonvolatile memory in accordance with the first command,
the first partial data sequence is a unit of a data sequence for which whether or not the first partial data sequence includes an error is determined in the nonvolatile memory, and
the first data sequence is a unit of a data sequence for which the second correction processing is performed in the memory controller.

20. The memory system of claim 19, wherein
the first partial data sequence has a data size smaller than that of the first data sequence.

21. The memory system of claim 12, wherein
the nonvolatile memory is comprised of one or more chips.

22. The memory system of claim 12, wherein
the nonvolatile memory further comprises a plurality of second memory cell transistors coupled to a second word line, and
based on a first partial data sequence output from the nonvolatile memory in accordance with the first command, the memory controller is configured to:
  read a second data sequence from the plurality of the second memory cell transistors;
  output, from the second data sequence, a third partial data sequence corresponding to the first partial data sequence; and
a number of bits of data stored in each of the plurality of first memory cell transistors is less than a number of bits of data stored in each of the plurality of second memory cell transistors.

23. The memory system of claim 12, wherein
each of the plurality of first memory cell transistors is configured to be capable of storing two- or more bit data, and
based on a first partial data sequence output from the nonvolatile memory in accordance with the first command, the memory controller is configured to:
  read a third data sequence, which differs from the first data sequence, from the plurality of the first memory cell transistors; and
  output, from the third data sequence, a fourth partial data sequence corresponding to the first partial data sequence.

24. The memory system of claim 12, wherein
a communication between the nonvolatile memory and the memory controller is compliant with an SDR (single data rate) interface, a toggle DDR (double data rate) interface, or an ONFI (open NAND flash interface).

* * * * *